(12) United States Patent
Kathirgamanathan et al.

(10) Patent No.: US 7,887,933 B2
(45) Date of Patent: *Feb. 15, 2011

(54) ELECTROLUMINESCENT MATERIALS AND DEVICES

(75) Inventors: Poopathy Kathirgamanathan, North Harrow (GB); Subramaniam Ganeshamurugan, London (GB); Sivagnanasundram Surendrakumar, London (GB)

(73) Assignee: Merck Patent GmbH, Darmstadt (DE)

( * ) Notice: Subject to any disclaimer, the term of this patent is extended or adjusted under 35 U.S.C. 154(b) by 776 days.

This patent is subject to a terminal disclaimer.

(21) Appl. No.: 11/796,256

(22) Filed: Apr. 27, 2007

(65) Prior Publication Data

US 2007/0259208 A1 Nov. 8, 2007

Related U.S. Application Data

(63) Continuation-in-part of application No. 10/483,137, filed as application No. PCT/GB02/03163 on Jul. 9, 2002, now Pat. No. 7,211,334.

(30) Foreign Application Priority Data

Jul. 9, 2001 (GB) .................................. 0116644.6

(51) Int. Cl.
*H01L 51/54* (2006.01)
*C09K 11/06* (2006.01)
(52) U.S. Cl. ....................... 428/690; 428/917; 313/504; 313/506; 257/E51.043; 252/301.16
(58) Field of Classification Search .................. 548/105, 548/106
See application file for complete search history.

(56) References Cited

U.S. PATENT DOCUMENTS 4,146,540 A * 3/1979 Avar et al. ................... 548/105
7,211,334 B2 * 5/2007 Kathirgamanathan et al. ........................... 428/690

* cited by examiner

*Primary Examiner*—Marie R. Yamnitzky
(74) *Attorney, Agent, or Firm*—David Silverstein; Andover-IP-Law

(57) ABSTRACT

An electroluminescent composition is provided comprising: (a) a compound of the general chemical formula (I):

wherein M is lithium, sodium, potassium, rubidium, caesium, beryllium, magnesium, calcium, strontium, barium, copper, silver, gold, zinc, boron, aluminum, gallium, indium, germanium, tin, antimony, lead, manganese, iron, ruthenium, osmium, cobalt, rhodium, iridium, nickel, palladium, platinum, cadmium or chromium; n is the valence of M; and $R_1$, $R_2$ and $R_3$ can be the same or different, and are selected from hydrogen, a substituted or unsubstituted aliphatic group, a substituted or unsubstituted aromatic, heterocyclic or polycyclic ring structure, a fluorocarbon, a halogen or a nitrile group; and (b) a suitable dopant. The composition may be used in forming electroluminescent devices.

39 Claims, 15 Drawing Sheets

ELECTROLUMINESCENT MATERIALS AND DEVICES

CROSS-REFERENCE TO RELATED APPLICATIONS

This application is a continuation-in-part of U.S. patent application Ser. No. 10/483,137 filed 5 Mar. 2004, now U.S. Pat. No. 7,211,334, which was a national stage application of International Application No. PCT/GB02/03163 filed 9 Jul. 2002 and claiming priority from UK application 01/16644.6 filed 9 Jul. 2001. The entire disclosures of these earlier related applications are incorporated herein by reference.

FIELD OF THE INVENTION

The present invention relates generally to electroluminescent materials and compositions, and to devices incorporating such electroluminescent materials.

BACKGROUND OF THE INVENTION

Materials which emit light when an electric current is passed through them are known as electroluminescent materials and are well known and used in a wide range of display applications. Liquid crystal devices and devices which are based on inorganic semiconductor systems are widely used, however these suffer from the disadvantages of high energy consumption, high cost of manufacture, low quantum efficiency and the inability to make flat panel displays.

Organic polymers have been proposed as useful in electroluminescent devices, but it is not possible to obtain pure colours, they are expensive to make and have a relatively low efficiency.

Another compound which has been proposed is aluminum quinolate, but this requires dopants to be used to obtain a range of colours and has a relatively low efficiency.

Patent application WO98/58037, which is incorporated herein by reference, describes a range of lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268, which are incorporated herein by reference, describe electroluminescent complexes, structures and devices using rare earth chelates.

Hitherto electroluminescent metal complexes have been based on a rare earth, transition metal, lanthanide or an actinide or have been quinolates such as aluminium quinolate.

SUMMARY OF THE INVENTION

In some embodiments the present invention employs pyrazolone complexes of aluminum and other metals which fluoresce deep blue and are therefore suitable for doping with a range of fluorescent or phosphorescent dopants to give electroluminescent devices with desirable hues and high efficiencies.

According to the invention there is provided a doped electroluminescent compound which has the formula

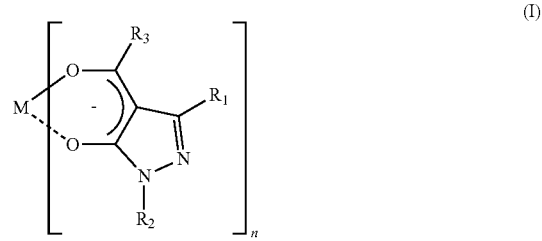

where M is a metal other than a rare earth, a transition metal, a lanthanide or an actinide; n is the valency of M; $R_1$, $R_2$ and $R_3$ which may be the same or different are selected from hydrogen, hydrocarbyl groups, substituted and unsubstituted aliphatic groups substituted and unsubstituted aromatic, heterocyclic and polycyclic ring structures, fluorocarbons such as trifluoryl methyl groups, halogens such as fluorine or thiophenyl groups or nitrile; $R_1$, and $R_3$ can also be form ring structures and $R_1$, $R_2$ and $R_3$ can be copolymerisable with a monomer e.g. styrene.

The invention also provides an electroluminescent device comprising (i) a first electrode, (ii) an electroluminescent layer comprising a layer of a complex of formula (I) and a dopant and (iii) a second electrode.

The invention further provides an electroluminescent device which comprises:

(i) a first electrode;

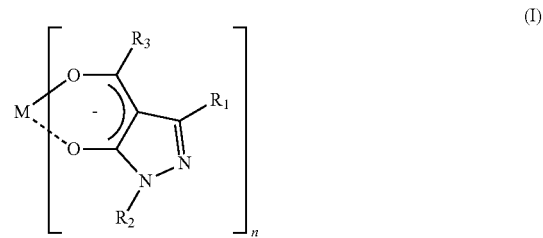

(ii) a layer of an electroluminescent material comprising a compound of formula I and a dopant; and (iii) a second electrode;

wherein, in Formula I,

M is lithium, sodium, potassium, rubidium, caesium, beryllium, magnesium, calcium, strontium, barium, copper, silver, gold, zinc, boron, aluminum, gallium, indium, germanium, tin, antimony, lead, manganese, iron, ruthenium, osmium, cobalt, rhodium, iridium, nickel, palladium, platinum, cadmium or chromium;

n is the valence of M; and $R_1$, $R_2$ and $R_3$ can be the same or different, and are selected from hydrogen, a substituted or unsubstituted aliphatic group, a substituted or unsubstituted aromatic, heterocyclic or polycyclic ring structure, a fluorocarbon, a halogen or a nitrile group.

In a further aspect the invention provides an electroluminescent composition comprising
(a) a compound of formula I;

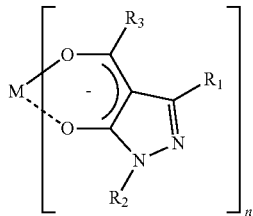

wherein M is lithium, sodium, potassium, rubidium, caesium, beryllium, magnesium, calcium, strontium, barium, copper, silver, gold, zinc, boron, aluminium, gallium, indium, germanium, tin, antimony, lead, manganese, iron, ruthenium, osmium, cobalt, rhodium, iridium, nickel, palladium, platinum, cadmium or chromium; n is the valence of M; and $R_1$, $R_2$ and $R_3$ can be the same or different, and are selected from hydrogen, a substituted or unsubstituted aliphatic group, a substituted or unsubstituted aromatic, heterocyclic or polycyclic ring structure, a fluorocarbon, a halogen or a nitrile group; and
(b) a dopant.

BRIEF DESCRIPTION OF THE DRAWINGS

Embodiments of the invention will now be described, by way of example only, with reference to the accompanying drawings in which.

DESCRIPTION OF PREFERRED EMBODIMENTS

Figure 1:
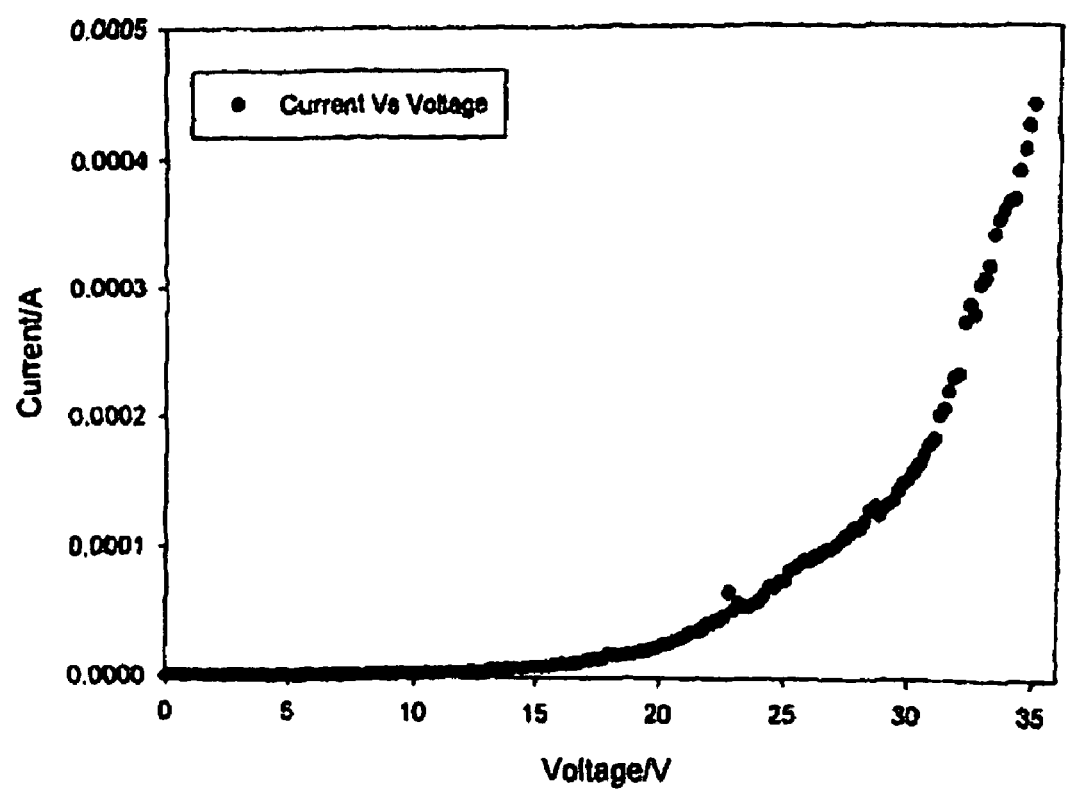
FIGS. 1-5 are a plot of current versus voltage, a plot of brightness against voltage, a plot of current efficiency against voltage, a plot of power efficiency against voltage, and an electroluminescence spectrum respectively for the device of Example 6 below.

A typical device according to the present invention comprises a transparent substrate on which are successively formed an anode layer, a hole injector (buffer) layer, a hole transport layer, an electroluminescent layer, an electron transport layer, an electron injection layer and a cathode layer which may in turn be laminated to a second transparent substrate. Top emitting OLEDs are also possible in which an aluminum or other metallic substrate carries an ITO layer, a hole injection layer, a hole transport layer, an electroluminescent layer, an electron transport layer, an electron injection layer and an ITO or other transparent cathode, light being emitted through the cathode. A further possibility is an inverted OLED in which a cathode of aluminum or aluminum alloyed with a low work function metal carries successively an electron injection layer, an electron transport layer, an electroluminescent layer, a hole transport layer, a hole injection layer and an ITO or other transparent conductive anode, emission of light being through the anode. If desired a hole blocking layer may be inserted e.g. between the electroluminescent layer and the electron transport layer.

The display of the invention may be monochromatic or polychromatic. Thus, a full color display can be formed by arranging three individual backplanes, each emitting a different primary monochrome color, on different sides of an optical system, from another side of which a combined color image can be viewed. Alternatively, rare earth chelate electroluminescent compounds emitting different colors can be fabricated so that adjacent diode pixels in groups of three neighboring pixels produce red, green and blue light. In a further alternative, field sequential color filters can be fitted to a white light emitting display.

In some embodiments either or both electrodes can be formed of silicon and the electroluminescent material and intervening layers of a hole transporting and electron transporting materials can be formed as pixels on the silicon substrate. Preferably, the substrate is of crystalline silicon and the surface of the substrate may be polished or smoothed to produce a flat surface prior to the deposition of electrode, or electroluminescent compound. Alternatively a non-planarized silicon substrate can be coated with a layer of conducting polymer to provide a smooth, flat surface prior to deposition of further materials.

In one embodiment, each pixel comprises a metal electrode in contact with the substrate. Depending on the relative work functions of the metal and transparent electrodes, either may serve as the anode with the other constituting the cathode.

When the silicon substrate is the cathode an indium tin oxide coated glass can act as the anode and light is emitted through the anode. When the silicon substrate acts as the anode the cathode can be formed of a transparent electrode which has a suitable work function, for example a thin layer of low work function material, e.g., indium tin oxide or indium zinc oxide. The anode can have a transparent coating of a metal formed on it to give a suitable work function. As previously explained, these devices are sometimes referred to as top emitting devices or back emitting devices.

The metal electrode may consist of a plurality of metal layers, for example a higher work function metal such as aluminium deposited on the substrate and a lower work function metal such as calcium deposited on the higher work function metal. In another example, a further layer of conducting polymer lies on top of a stable metal such as aluminum.

Preferably, the electrode also acts as a mirror behind each pixel and is either deposited on, or sunk into, the planarised surface of the substrate. However, there may alternatively be a light absorbing black layer adjacent to the substrate.

In still another embodiment, selective regions of a bottom conducting polymer layer are made non-conducting by exposure to a suitable aqueous solution allowing formation of arrays of conducting pixel pads which serve as the bottom contacts of the pixel electrodes.

As described in WO00/60669 the brightness of light emitted from each pixel is preferably controllable in an analog manner by adjusting the voltage or current applied by the matrix circuitry or by inputting a digital signal which is converted to an analogue signal in each pixel circuit. The substrate preferably also provides data drivers, data converters and scan drivers for processing information to address the array of pixels so as to create images. When an electroluminescent material is used which emits light of a different colour depending on the applied voltage the color of each pixel can be controlled by the matrix circuitry. In one embodiment, each pixel is controlled by a switch comprising a voltage controlled element and a variable resistance element, both of which are conveniently formed by metal-oxide-semiconductor field effect transistors (MOSFETs) or by an active matrix transistor.

Anode

As previously explained, in many embodiments the anode is formed by a layer of doped tin oxide or indium tin oxide coated onto glass or other transparent substrate. Other materials that may be used include antimony tin oxide and indium zinc oxide.

Hole Injection Materials

A single layer may be provided between the anode and the electroluminescent material, but in many embodiments there are at least two layers one of which is a hole injection layer (buffer layer) and the other of which is a hole transport layer, the two layer structure offering in some embodiments improved stability and device life—see U.S. Pat. No. A-4,720,432 (VanSlyke et al., Kodak). The hole injection layer may serve to improve the film formation properties of subsequent organic layers and to facilitate the injection of holes into the hole transport layer.

Suitable materials for the hole injection layer which may be of thickness e.g. 0.1-200 nm depending on material and cell type e.g. about 25 nm include hole-injecting porphyrinic compounds—see, e.g., U.S. Pat. No. A-4,356,429 (Tang, Eastman Kodak)—e.g., zinc phthalocyanine, copper phthalocyanine, and ZnTpTP, whose formula is set out below:

fluorocarbon gas—see U.S. Pat. No. A-6,208,075 (Hung et al; Eastman Kodak)—a triarylamine polymer—see EP-A-0891121 (Inoue et al., TDK Corporation)—or a phenylenediamine derivative—see EP-A-1029909 (Kawamura et al., Idemitsu).

Hole-Transport Materials

Hole transport layers which may be used are preferably of thickness 20 to 200 nm.

One class of hole transport materials comprises polymeric materials that may be deposited as a layer by means of spin coating or ink jet printing. Such polymeric hole-transporting materials include poly(N-vinylcarbazole) (PVK), polythiophenes, polypyrrole, and polyaniline. Other hole transporting materials are conjugated polymers e.g. poly(p-phenylenevinylene) (PPV) and copolymers including PPV. Other preferred polymers are: poly(2,5 dialkoxyphenylene vinylenes, e.g., poly(2-methoxy-5-(2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group; polyfluorenes and oligofluorenes; polyphenylenes and oligophenylenes; polyanthracenes and oligo anthracenes; and polythiophenes and oligothiophenes.

A further class of hole transport materials comprises sublimable small molecules. For example, aromatic tertiary amines provide a class of preferred hole-transport materials, e.g. aromatic tertiary amines including at least two aromatic tertiary amine moieties (e.g. those based on biphenyl diamine or of a "starburst" configuration), of which the following are representative:

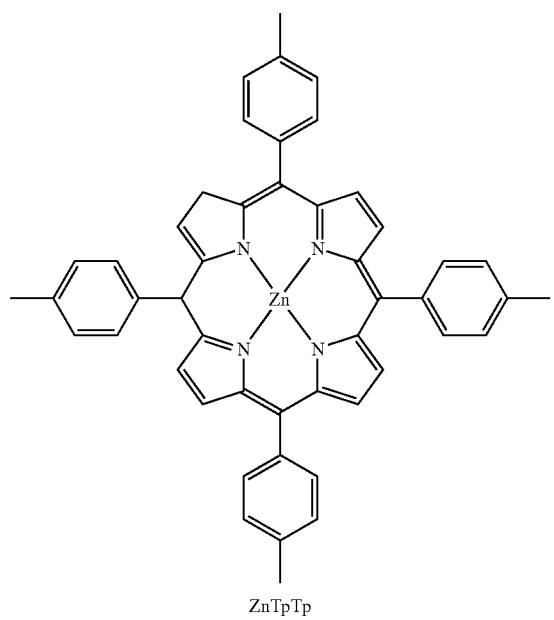

ZnTpTp

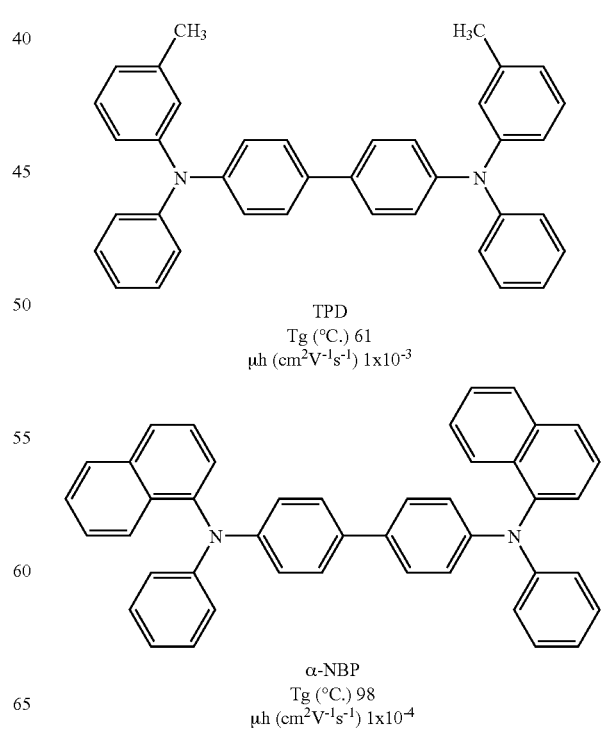

TPD
Tg (°C.) 61
μh (cm$^2$V$^{-1}$s$^{-1}$) 1x10$^{-3}$

α-NBP
Tg (°C.) 98
μh (cm$^2$V$^{-1}$s$^{-1}$) 1x10$^{-4}$

Particularly good device lifetimes may be obtained where the hole injection layer is ZnTpTP and the electron transport layer is zirconium or hafnium quinolate.

The hole injection layer may also be a fluorocarbon-based conductive polymer formed by plasma polymerization of a

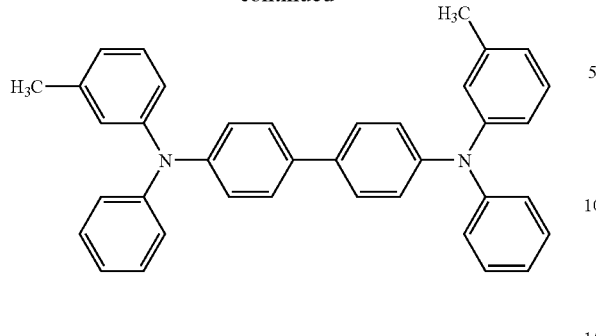

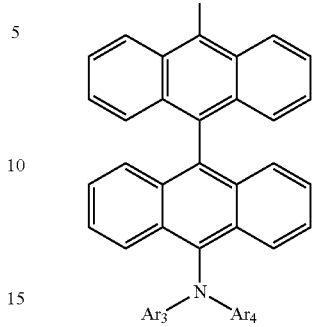

wherein $Ar_1$—$Ar_4$ which may be the same or different may be phenyl, biphenyl, naphthyl or

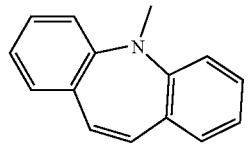

which may optionally be substituted by $C_1$-$C_4$ alkyl e.g. methyl or $C_1$-$C_4$ alkoxy e.g. methoxy. Typical compounds include:

9-(10-(N-(naphthalen-1-yl)-N-phenylamino)anthracen-9-yl)-N-(naphthalen-1-yl)-N-phenylanthracen-10-amine (Compound Y in the Examples);

9-(10-(N-biphenyl-N-2-m-tolylamino)anthracen-9-yl)-N-biphenyl-N-2-m-tolylamino-anthracen-10-amine; and 9-(10-(N-phenyl-N-m-tolylamino)anthracen-9-yl)-N-phenyl-N-m-tolylanthracen-10-amine.

Electroluminescent Materials

In the electroluminescent materials of the formula set out above, examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

$R_1$ and $R_2$ can be $Ph_1$ and $Ph_2$ and at least one of $Ph_1$ and $Ph_2$ is preferably a substituted or unsubstituted aromatic compound and the other moiety is selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine; substituted and unsubstituted fused aromatic, heterocyclic and polycyclic ring structures and can be copolymerisable with a monomer e.g. styrene, fluorocarbons such as trifluoryl methyl groups, halogens such as fluorine. Examples include aliphatic, aromatic and heterocyclic alkoxy, aryloxy and carboxy groups, substituted and substituted phenyl, fluorophenyl, biphenyl, phenanthrene, anthracene, naphthyl and fluorene groups, alkyl groups such as t-butyl, heterocyclic groups such as carbazole. A preferred group is methyl.

Examples of $R_3$ are $C_1$ to $C_5$ alkyl groups such as methyl, ethyl, propyl, butyl, and pentyl, groups such as $(CH_2)(CH_3)_3$, and phenyl groups.

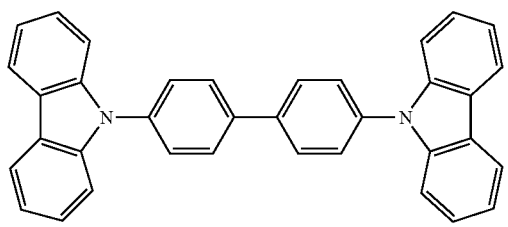

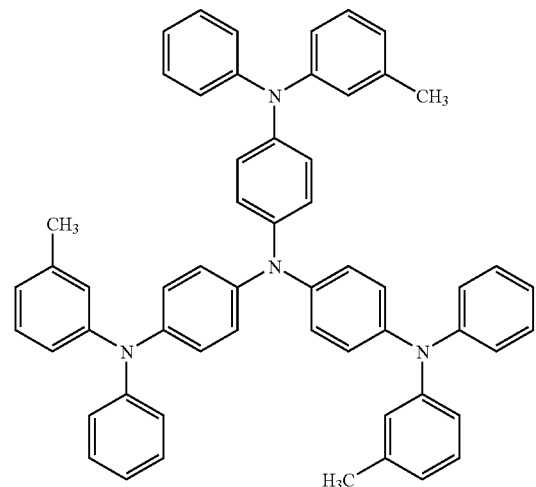

m-MTDATA.
Tg (°C.) 75
$\mu h$ ($cm^2 V^{-1} s^{-1}$) $2.7 \times 10^{-5}$

It further includes spiro-linked molecules which are aromatic amines e.g. spiro-TAD (2,2',7,7'-tetrakis-(diphenylamino)-spiro-9,9'-bifluorene).

A further class of small molecule hole transport materials is disclosed in WO 2006/061594 (Kathirgamanathan et al), which is incorporated herein by reference and is based on diamino dainthracenes e.g. of formula M can be any metal compound selected from non rare earth metals e.g. lithium, sodium, potassium, rubidium, caesium, beryllium, magnesium, calcium, strontium, barium, copper, silver, gold, zinc, boron, aluminum, gallium, indium, germanium, tin, antimony, lead, manganese, iron, ruthenium, osmium, cobalt, osmium, rhodium, iridium, nickel, palladium, platinum, cadmium, nickel, chromium and metals of the first, second and third groups of transition metals. etc. which emits light when an electric current is passed through it.

When M is platinum or palladium the complex can be non-stoichiometric, i.e. of formula $M_xL_y$ where M is the metal and L is the organic ligand. In a stoichiometric complex x will be one and y will be the valence state of the metal, in a non-stoichiometric complex x and y can have different values e.g. x is two and y is three. It is possible that some kind of linked or polymeric structure is formed and/or the metal is present in more than one valence state.

A preferred metal is aluminum and $R_3$ is preferably a phenyl or substituted phenyl group. Particular compounds which may be doped as described below include the following:

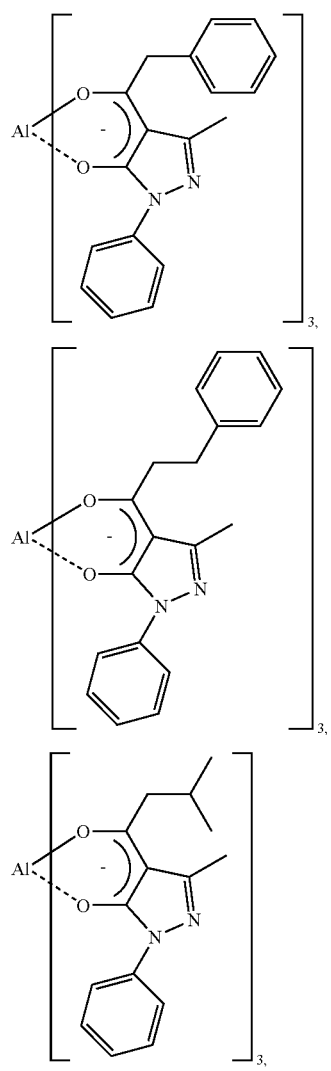

-continued

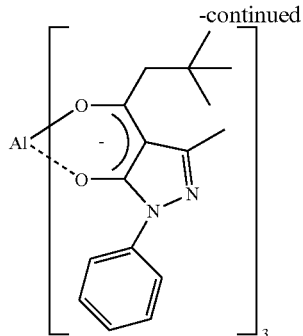

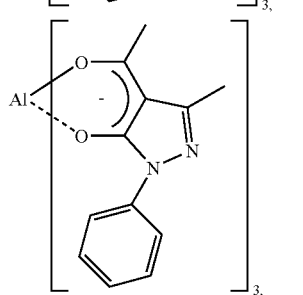

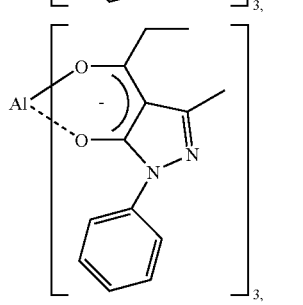

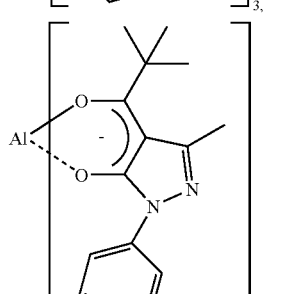

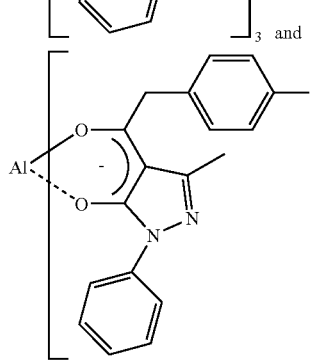

A compound as described above may be doped with dyes such as fluorescent laser dyes, luminescent laser dyes to modify the color spectrum of the emitted light and/or to and also enhance the photoluminescent and electroluminescent efficiencies. The compound can also be mixed with a polymeric material such as a polyolefin e.g. polyethylene, polypropylene etc. and preferably polystyrene. It may also be mixed with a conjugated polymer to impart conductivity and/or electroluminescence and/or fluorescent properties.

Preferably the compound is doped with a minor amount of a fluorescent or phosphorescent material as a dopant, preferably in an amount of 0.01 to 25% by weight of the doped mixture. The dopant is more preferably present in the compound in an amount of 0.01% to 5% by weight e.g. in an amount of 0.01% to 2%.

The doped compound can be deposited on a substrate by any conventional method, e.g., any of the following:

(a) Directly by vacuum evaporation of a mixture of the compound and dopant.

(b) Evaporation from a solution in an organic solvent or co evaporation of the compound and dopant. The solvent which is used will depend on the material but chlorinated hydrocarbons such as dichloromethane and n-methylpyrrolidone; dimethyl sulfoxide; tetrahydrofuran; dimethylformamide etc. are suitable in many cases.

(c) Spin coating of the compound and dopant from solution.

(d) Sputtering.

(e) Melt deposition.

As discussed in U.S. Pat. No. A-4,769,292 (Tang et al., Kodak), the contents of which are included by reference, the presence of the fluorescent material permits a choice from amongst a wide latitude of wavelengths of light emission. In particular, as disclosed in U.S. Pat. No. A-4,769,292 by blending with the present compounds a minor amount of a fluorescent material capable of emitting light in response to hole-electron recombination, the hue of the light emitted from the luminescent zone, can be modified. In theory, if a compound as set out above and a fluorescent material could be found for blending which have exactly the same affinity for hole-electron recombination, each material should emit light upon injection of holes and electrons in the luminescent zone. The perceived hue of light emission would be the visual integration of both emissions. However, since imposing such a balance of compound as defined above and fluorescent materials is limiting, it is preferred to choose the fluorescent material so that it provides the favoured sites for light emission. When only a small proportion of fluorescent material providing favoured sites for light emission is present, peak intensity wavelength emissions typical of the compound as set out above can be entirely eliminated in favour of a new peak intensity wavelength emission attributable to the fluorescent material.

While the minimum proportion of fluorescent material sufficient to achieve this effect varies, in no instance is it necessary to employ more than about 10 mole percent fluorescent material, based on the compound as set out above and seldom is it necessary to employ more than 1 mole percent of the fluorescent material. On the other hand, limiting the fluorescent material present to extremely small amounts, typically less than about $10^{-3}$ mole percent, based on the compound as set out above, can result in retaining emission at wavelengths characteristic of the compound as set out above. Thus, by choosing the proportion of a fluorescent material capable of providing favoured sites for light emission, either a full or partial shifting of emission wavelengths can be realized. This allows the spectral emissions of the EL devices to be selected and balanced to suit the application to be served. In the case of fluorescent dyes, typical amounts are 0.01 to 5 wt %, for example 2-3 wt %. In the case of phosphorescent dyes typical amounts are 0.1 to 15 wt %. In the case of ion phosphorescent materials typical amounts are 0.01-25 wt % or up to 100 wt %.

Choosing fluorescent materials capable of providing favoured sites for light emission, necessarily involves relating the properties of the fluorescent material to those of the compound as set out above. The above compound can be viewed as a collector for injected holes and electrons with the fluorescent material providing the molecular sites for light emission. One important relationship for choosing a fluorescent material capable of modifying the hue of light emission when present in the compound set out above is a comparison of the reduction potentials of the two materials. The fluorescent materials demonstrated to shift the wavelength of light emission have exhibited a less negative reduction potential than that of the compound as set out above. Reduction potentials, measured in electron volts, have been widely reported in the literature along with varied techniques for their measurement. Since it is a comparison of reduction potentials rather than their absolute values which is desired, it is apparent that any accepted technique for reduction potential measurement can be employed, provided both the fluorescent and compound set out above reduction potentials are similarly measured. A preferred oxidation and reduction potential measurement techniques is reported by R. J. Cox, *Photographic Sensitivity*, Academic Press, 1973, Chapter 15.

A second important relationship for choosing a fluorescent material capable of modifying the hue of light emission when present in the compound set out above is a comparison of the band-gap potentials of the two materials. The fluorescent materials demonstrated to shift the wavelength of light emission have exhibited a lower band gap potential than that of the compound set out above. The band gap potential of a molecule is taken as the potential difference in electron volts (eV) separating its ground state and first singlet state. Band gap potentials and techniques for their measurement have been widely reported in the literature. The band gap potentials herein reported are those measured in electron volts (eV) at an absorption wavelength which is bathochromic to the absorption peak and of a magnitude one tenth that of the magnitude of the absorption peak. Since it is a comparison of band gap potentials rather than their absolute values which is desired, it is apparent that any accepted technique for band gap measurement can be employed, provided both the fluorescent and quinolate band gaps are similarly measured. One illustrative measurement technique is disclosed by F. Gutman and L. E. Lyons, *Organic Semiconductors*, Wiley, 1967, Chapter 5.

With the compounds set out above as described above which are themselves capable of emitting light in the absence of the fluorescent material, it has been observed that suppression of light emission at the wavelengths of emission characteristics of the compound alone and enhancement of emission at wavelengths characteristic of the fluorescent material occurs when spectral coupling of the compound and fluorescent material is achieved. By "spectral coupling" it is meant that an overlap exists between the wavelengths of emission characteristic of the compound alone and the wavelengths of light absorption of the fluorescent material in the absence of the compound. Optimal spectral coupling occurs when the emission wavelength of the compound is within ±25 nm of the maximum absorption of the fluorescent material alone. In practice advantageous spectral coupling can occur with peak emission and absorption wavelengths differing by up to 100 nm or more, depending on the width of the peaks and their hypsochromic and bathochromic slopes. Where less than optimum spectral coupling between the compound and fluorescent materials is contemplated, a bathochromic as compared to a hypsochromic displacement of the fluorescent material produces more efficient results.

Useful fluorescent materials are those capable of being blended with the a compound as set out above and fabricated into thin films satisfying the thickness ranges described above forming the luminescent zones of the EL devices of this invention. While crystalline organometallic complexes do not lend themselves to thin film formation, the limited amounts of fluorescent materials present in the compound permit the use of fluorescent materials which are alone incapable of thin film formation. Preferred fluorescent materials are those which form a common phase with the compound. Fluorescent dyes constitute a preferred class of fluorescent materials, since dyes lend themselves to molecular level distribution in the compound. Although any convenient technique for dispersing the fluorescent dyes in the compound can be used preferred fluorescent dyes are those which can be vacuum vapor deposited along with the compounds set out above.

Fluorescent laser dyes are recognized to be particularly useful fluorescent materials for use in the organic EL devices of this invention. Dopants which can be used include diphenylacridine, coumarins, perylene and their derivatives. Useful fluorescent dopants are disclosed in U.S. Pat. No. 4,769,292, which is incorporated herein by reference.

One class of preferred dopants is coumarins e.g. those of the formula:

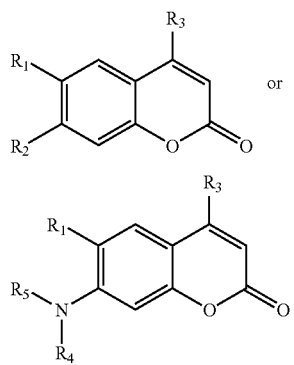

wherein $R_1$-$R_5$ represent hydrogen or alkyl e.g. methyl or ethyl. Compounds of this type include 7-hydroxy-2H-chromen-2-one, 7-hydroxy-2-oxo-2H-chromene-3-carbonitrile, 7-hydroxy-4-methyl-2-oxo-2H-chromene-3-carbonitrile, 7-(ethylamino)-4,6-dimethyl-2H-chromen-2-one, 7-amino-4-methyl-2H-chromen-2-one, 7-(diethylamino)-4-methyl-2H-chromen-2-one, 7-hydroxy-4-methyl-2H-chromen-2-one, 7-(dimethylamino)-4-(trifluoromethyl)-2H-chromen-2-one, and 7-(dimethylamino)-2,3-dihydrocyclopenta[c]chromen-4(1H)-one. In addition the following dyes may be used:

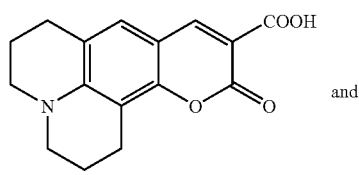

and

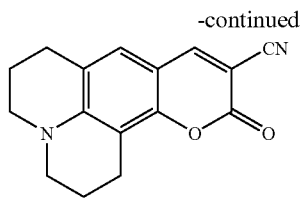

Further dopants that may be used include 3-(benzo[d]thiazol-2-yl)-8-(diethylamino)-2H-benzo[g]chromen-2-one, 3-(1H-benzo[d]imidazol-2-yl)-8-(diethylamino)-2H-benzo[g]chromen-2-one, 9-(pentan-3-yl)-1H-benzo[a]phenoxazin-5(4H, 7aH, 12aH)-one and 10-(2-benzothiazolyl)-1,1,7,7-tetramethyl-2,3,6,7-tetrahydro-1H, 5H, 11H-[1]benzopyrano[6,7,8-ij]quinolizin-11-one (C-545-T) of formula below and analogs such as C-545TB and C545MT:

C-545T

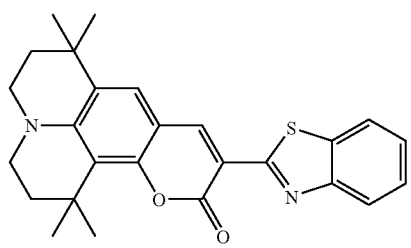

C-545TB

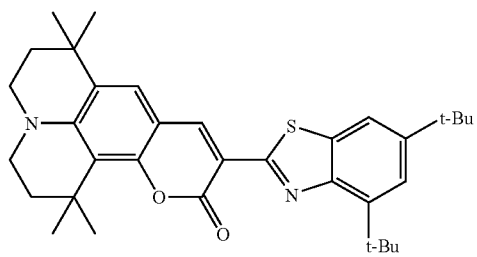

C545MT

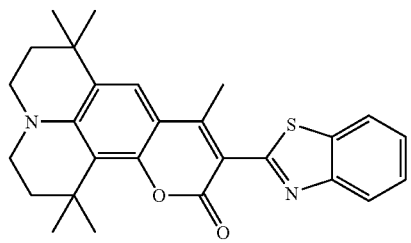

Further dopants that can be used include pyrene and perylene compounds e.g. compounds of one of the formulae below:

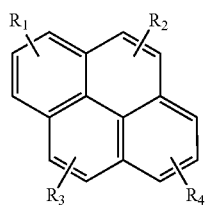

-continued

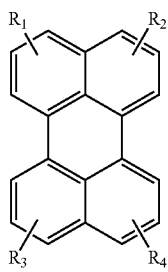

wherein $R_1$ to $R_4$ which may be the same or different are selected from hydrogen, hydrocarbyl groups, substituted and unsubstituted aromatic, heterocyclic and polycyclic ring structures, fluorocarbons e.g. trifluoromethyl, halogen e.g. fluorine or thiophenyl or can be substituted or unsubstituted fused aromatic, heterocyclic and polycyclic ring structures. Of the above compounds, preferred are compounds wherein $R_1$ to $R_4$ are selected from hydrogen and t-butyl e.g. perylene and tetrakis-t-butyl perylene which because of the steric effects of the t-butyl groups does not crystallize out of the matrix and is of formula:

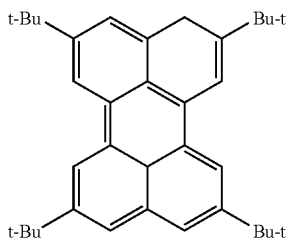

$R_1$ to $R_4$ may also be copolymerisable with a monomer e.g. styrene and may be unsaturated alkylene groups such as vinyl groups or groups —$CH_2$—CH=CH—R wherein R is hydrocarbyl, aryl, heterocyclic, carboxy, aryloxy, hydroxy, alkoxy, amino or substituted amino e.g. styryl. Compounds of this type include polycyclic aromatic hydrocarbons containing at least four fused aromatic rings and optionally one or more alkyl substituents e.g. perylene, tetrakis-(t-butyl)-perylene and 7-(9-anthryl)-dibenzo[a,o]perylene (pAAA) of structure:

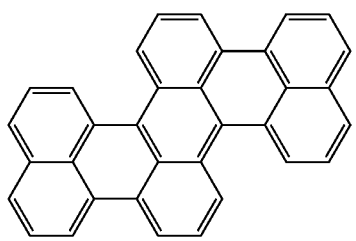

Bis-perylene and dianthryl dopants may also be employed.

Other dopants include salts of bis benzene sulfonic acid (require deposition by spin-coating rather than sublimation) such as

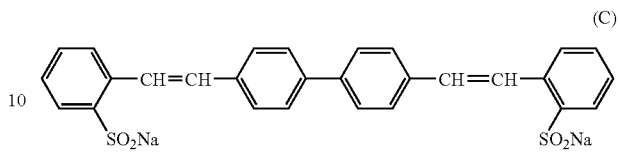
(C)

and perylene and perylene derivatives.

Various fluorescent dopants based inter alia on iridium are disclosed in WO 2005/080526, WO 2006/003408, WO 2006/016193, WO 2006/024878 and WO 2006/087521, the disclosures of which are incorporated herein by reference.

For example, the dopant may be a complex of a general formula selected from:

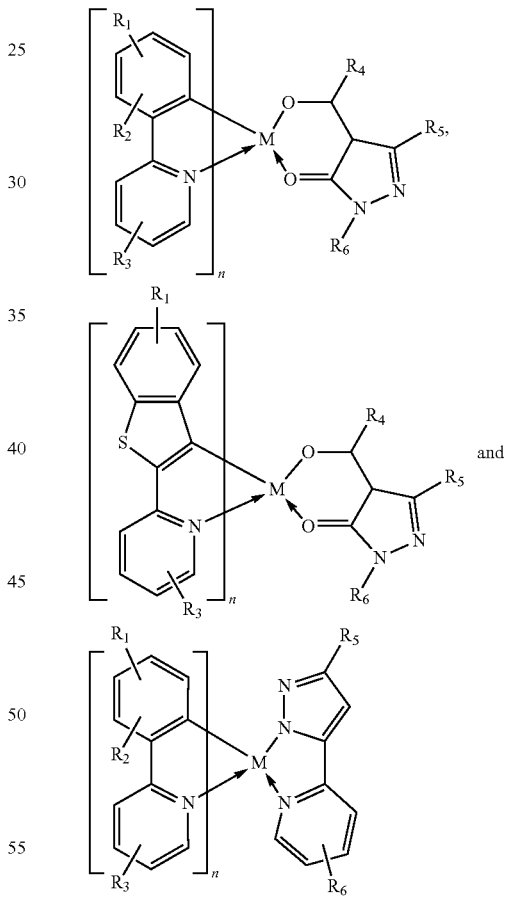

wherein $R_1$, $R_2$, and $R_3$ which may be the same or different are selected from the group consisting of hydrogen, alkyl, trifluoromethyl or fluoro; and $R_4$, $R_5$ and $R_6$ which can be the same or different are selected from the group consisting of hydrogen, alkyl or phenyl which may be unsubstituted or may have one or more alkyl, alkoxy, trifluoromethyl or fluoro substituents;

M is ruthenium, rhodium, palladium, osmium, iridium or platinum; and n is 1 or 2.

The dopant may also be a complex of a general formula selected from:

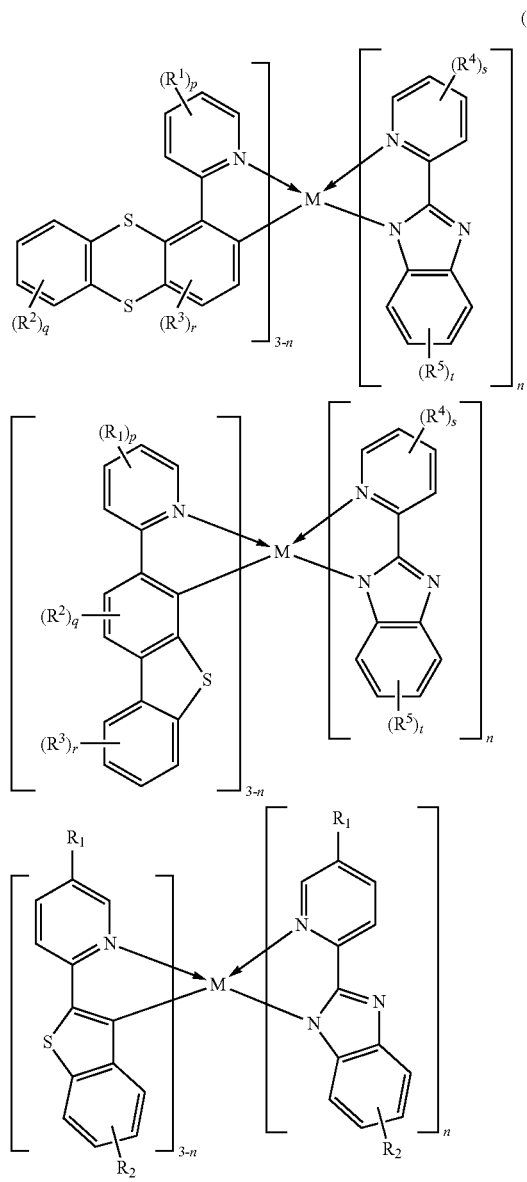

wherein

M is ruthenium, rhodium, palladium, osmium, iridium or platinum;

n is 1 or 2;

$R_1$, $R_2$, $R_3$, $R_4$ and $R_5$ which may be the same or different are selected from the group consisting of hydrogen, hydrocarbyl, hydrocarbyloxy, halogen, nitrile, amino, dialkylamino, arylamino, diarylamino and thiophenyl;

p, s and t are independently are 0, 1, 2 or 3, subject to the proviso that where any of p, s and t is 2 or 3 only one of them can be other than saturated hydrocarbyl or halogen;

q and r are independently are 0, 1 or 2, subject to the proviso that when q or r is 2, only one of them can be other than saturated hydrocarbyl or halogen.

In embodiments, for the compounds described above described above (a) Compounds of the formula below can serve as red dopants:

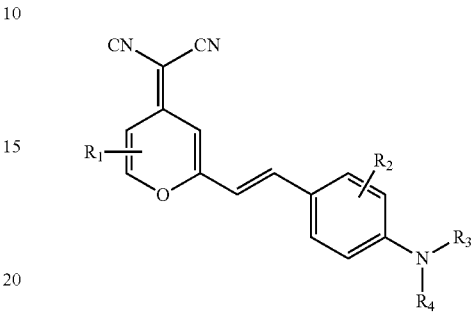

wherein $R_1$ represents alkyl e.g. methyl, ethyl or t-butyl, $R_2$ represents hydrogen or alkyl e.g. methyl, ethyl or t-butyl and $R_3$ and $R_4$ represent hydrogen, alkyl e.g. methyl or ethyl or six-membered ring structures fused to one another and to the phenyl ring at the 3- and 5-positions and optionally further substituted with one or two alkyl e.g. methyl groups. Examples of such compounds include

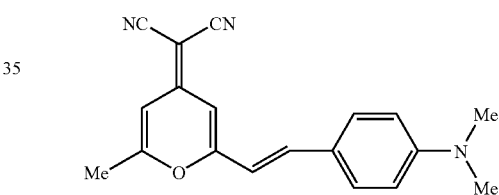

DCM

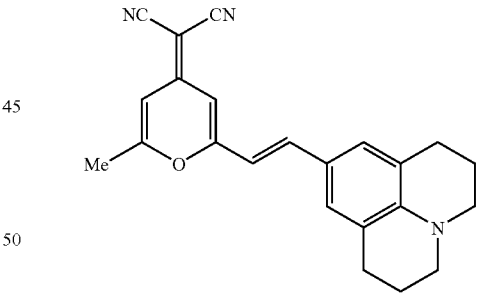

DCJT

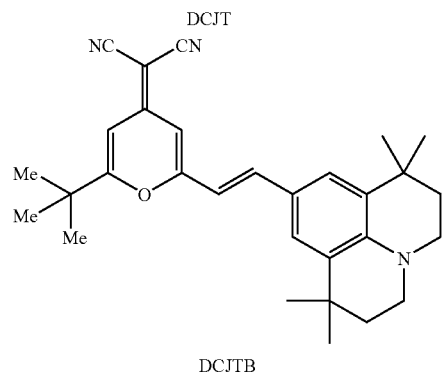

DCJTB

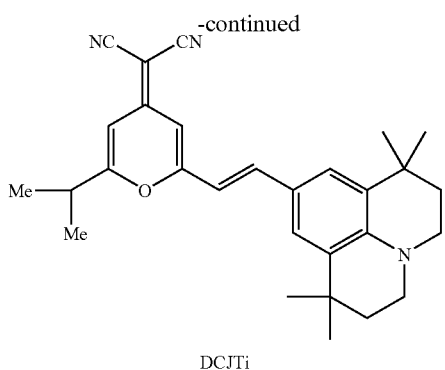
DCJTi
Particular phosphorescent materials that can be used as red dopants (see WO 2005/080526, the disclosure of which is incorporated herein by reference) include the following:
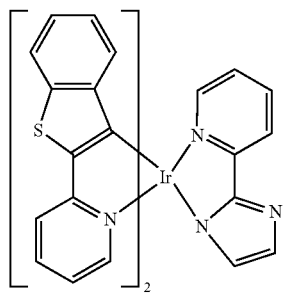
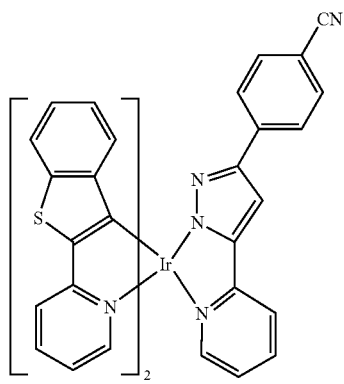
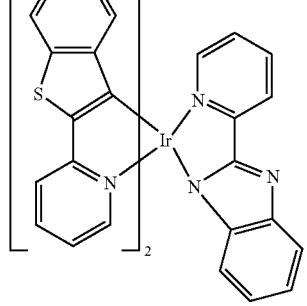
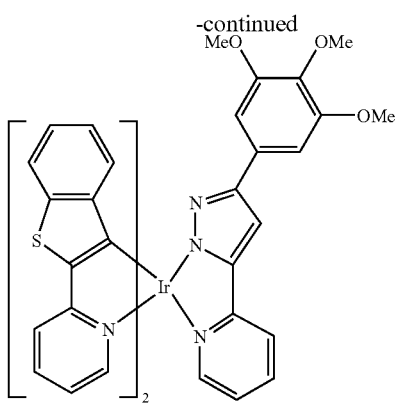
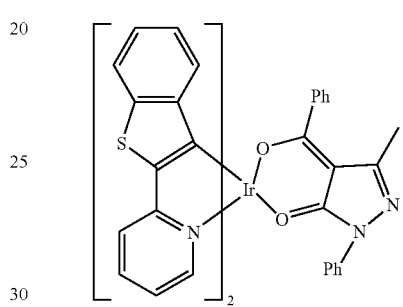
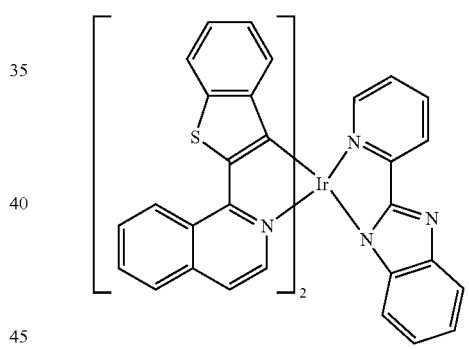
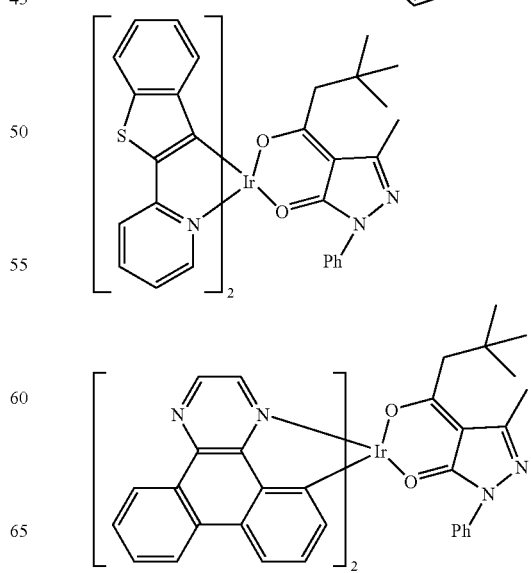

(b) The compounds below, for example, can serve as green dopants:

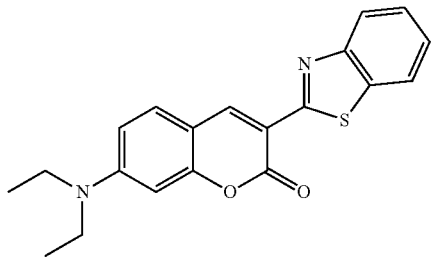

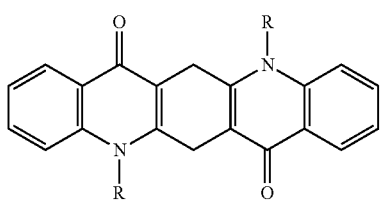

wherein R is $C_1$-$C_4$ alkyl, monocyclic aryl, bicyclic aryl, monocyclic heteroaryl, bicyclic heteroaryl, aralkyl or thienyl, preferably phenyl; and Further phosphorescent compounds that can be used as green dopants include the following compounds (see WO 2005/080526);

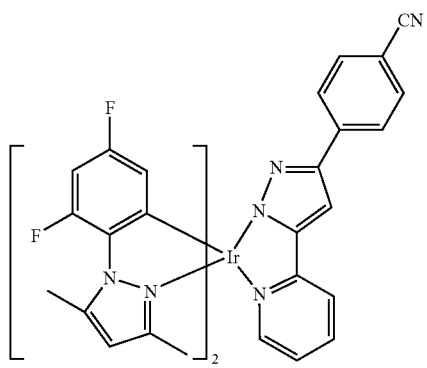

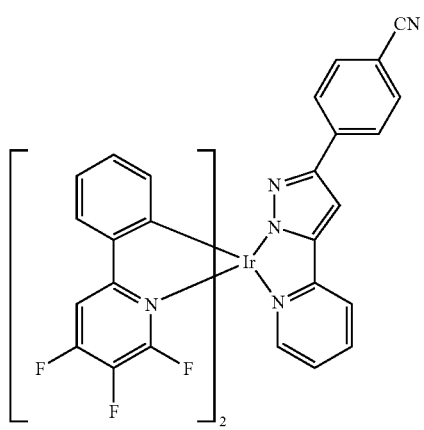

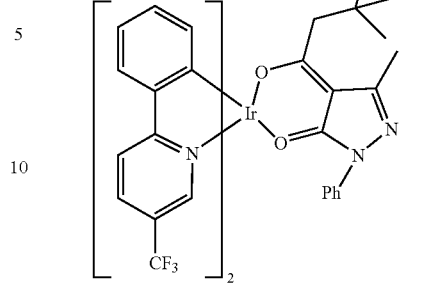

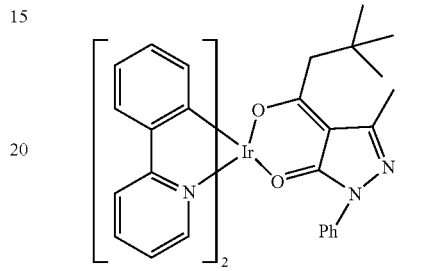

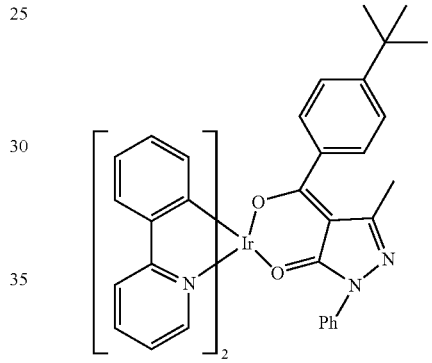

(c) The compounds perylene and 9-(10-(N-(naphthalen-8-yl)-N-phenylamino)anthracen-9-yl)-N-(naphthalen-8-yl)-N-phenylanthracen-10-amine can serve as a blue dopants.

Yet further possible dopants comprise aromatic tertiary amines including at least two aromatic tertiary amine moieties (e.g. those based on biphenyl diamine or of a "starburst" configuration) as described above as hole transport materials.

Other dopants are dyes such as the fluorescent 4-dicyanomethylene-4H-pyrans and 4-dicyanomethylene-4H-thiopyrans, e.g. the fluorescent dicyanomethylenepyran and thiopyran dyes. Useful fluorescent dyes can also be selected from among known polymethine dyes, which include the cyanines, complex cyanines and merocyanines (i.e. tri-, tetra- and poly-nuclear cyanines and merocyanines), oxonols, hemioxonols, styryls, merostyryls, and streptocyanines. The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts.

Other useful classes of fluorescent dyes are 4-oxo-4H-benz-[d,e]anthracenes and pyrylium, thiapyrylium, selenapyrylium, and telluropyrylium dyes.
Yet further phosphorescent dopants (see WO 2005/080526) include the following compounds:
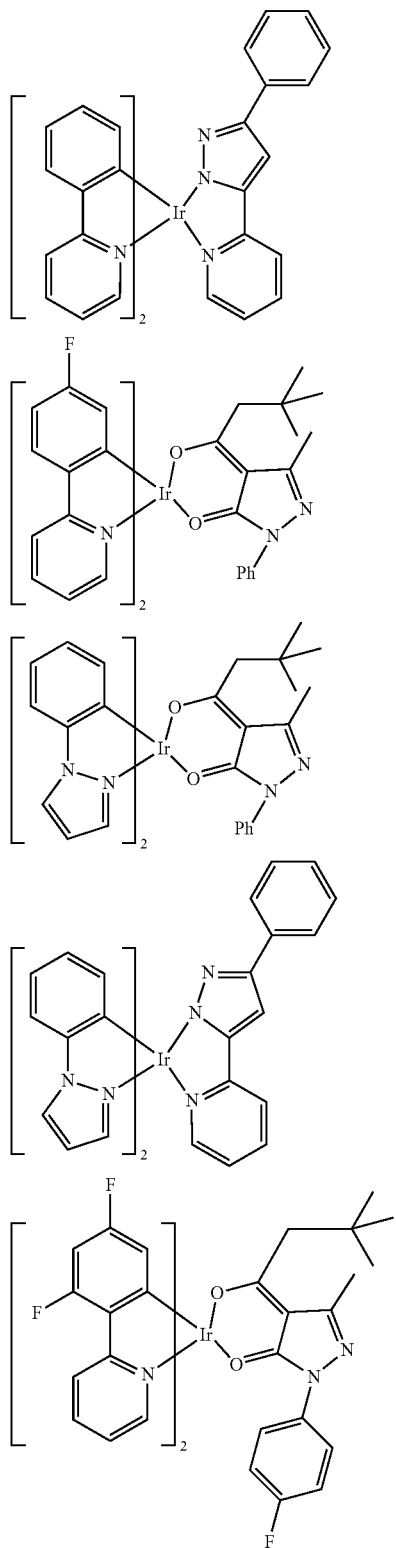
-continued
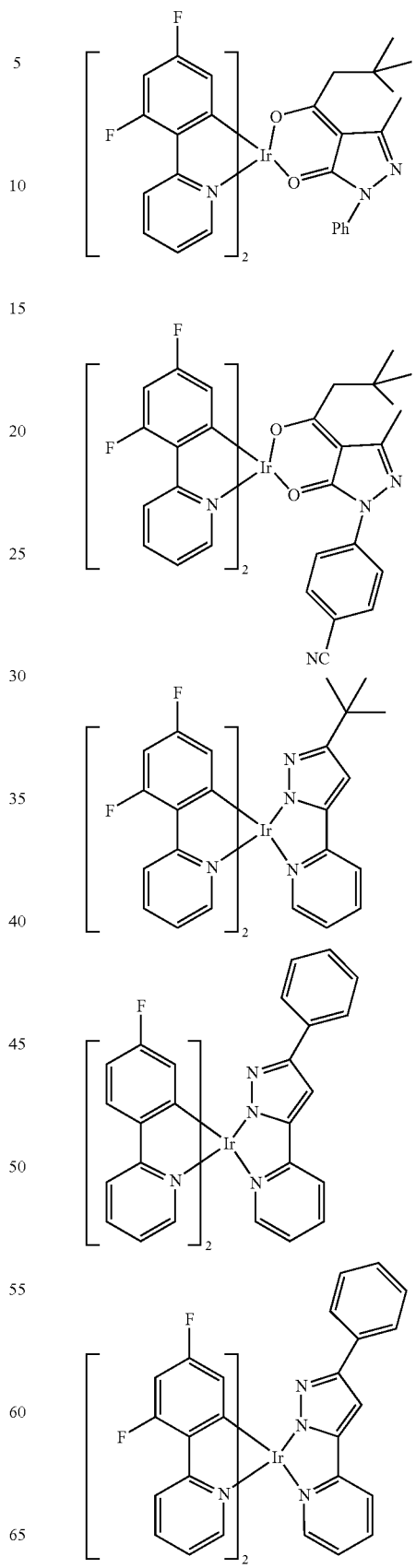

-continued

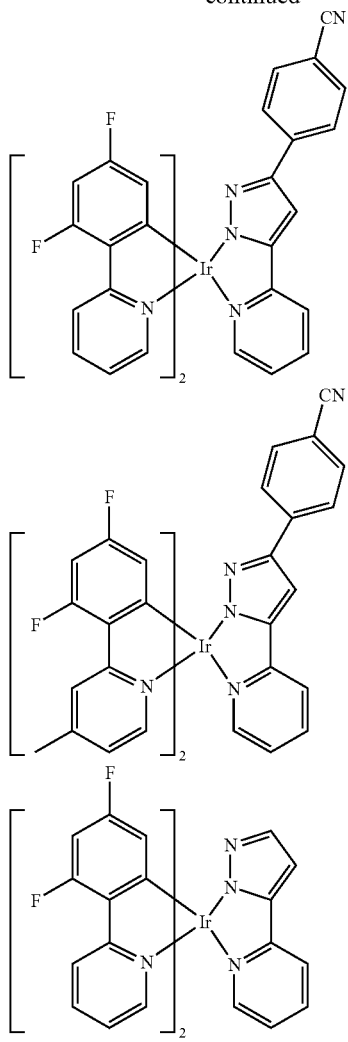

Rare earth chelates are yet further possible dopants, e.g. of the formula $(L\alpha)_n M$ or $(L\alpha)n{>}M{\leftarrow}Lp$ where $L\alpha$ and $Lp$ are organic ligands, M is a rare earth metal and n is the valence of the metal M. Examples of such compounds are disclosed in patent application WO98/58037 which describes a range of lanthanide complexes and also those disclosed in U.S. Pat. Nos. 6,524,727; 6,565,995; 6,605,317; 6,717,354 and 7,183,008. The disclosure of each of these patents is incorporated herein by reference.

Electron Transport Material

Kulkarni et al., *Chem. Mater.* 2004, 16, 4556-4573 (the contents of which are incorporated herein by reference) have reviewed the literature concerning electron transport materials (ETMs) used to enhance the performance of organic light-emitting diodes (OLEDs). In addition to a large number of organic materials, they discuss metal chelates including aluminum quinolate, which they explain remains the most widely studied metal chelate owing to its superior properties such as high EA (∼−3.0 eV; measured by the present applicants as −2.9 eV) and IP (∼−5.95 eV; measured by the present applicants as about −5.7 eV), good thermal stability (Tg ∼172° C.) and ready deposition of pinhole-free thin films by vacuum evaporation. Aluminum quinolate remains a preferred material and a layer of aluminum quinolate may be incorporated as electron transfer layer if desired.

Further preferred electron transport materials consist of or comprise zirconium, hafnium or lithium quinolate.

Zirconium quinolate has a particularly advantageous combination of properties for use as an electron transport material and which identify it as being a significant improvement on aluminium quinolate for use as an electron transport material. It has high electron mobility. Its melting point (388° C.) is lower than that of aluminum quinolate (414° C.). It can be purified by sublimation and unlike aluminum quinolate it resublimes without residue, so that it is even easier to use than aluminum quinolate. Its lowest unoccupied molecular orbital (LUMO) is at −2.9 eV and its highest occupied molecular orbital (HOMO) is at −5.6 eV, similar to the values of aluminum quinolate. Furthermore, unexpectedly, it has been found that when incorporated into a charge transport layer it slows loss of luminance of an OLED device at a given current with increase of the time for which the device has been operative (i.e. increases device lifetime), or increases the light output for a given applied voltage, the current efficiency for a given luminance and/or the power efficiency for a given luminance. Embodiments of cells in which the electron transport material is zirconium quinolate can exhibit reduced turn-on voltage and up to four times the lifetime of similar cells in which the electron transport material is zirconium quinolate. It is compatible with aluminum quinolate when aluminum quinolate is used as host in the electroluminescent layer of an OLED, and can therefore be employed by many OLED manufacturers with only small changes to their technology and equipment. It also forms a good electrical and mechanical interface with inorganic electron injection layers e.g. a LiF layer where there is a low likelihood of failure by delamination. Of course zirconium quinolate can be used both as host in the electroluminescent layer and as electron transfer layer. The properties of hafnium quinolate are generally similar to those of zirconium quinolate.

Zirconium or hafnium quinolate may be the totality, or substantially the totality of the electron transport layer. It may be a mixture of co-deposited materials which is predominantly zirconium quinolate. The zirconium or hafnium may be doped as described in GB 06 14847.2 filed 26 Jul. 2006, the contents of which are incorporated herein by reference. Suitable dopants include fluorescent or phosphorescent dyes or ion fluorescent materials e.g. as described above in relation to the electroluminescent layer, e.g. in amounts of 0.01-25 wt % based on the weight of the doped mixture. Other dopants include metals which can provide high brightness at low voltage. Additionally or alternatively, the zirconium or hafnium quinolate may be used in admixture with another electron transport material. Such materials may include complexes of metals in the trivalent or pentavalent state which should further increase electron mobility and hence conductivity. The zirconium and hafnium quinolate may be mixed with a quinolate of a metal of group 1, 2, 3, 13 or 14 of the periodic table, e.g. lithium quinolate or zinc quinolate. Preferably the zirconium or hafnium quinolate comprises at least 30 wt % of the electron transport layer, more preferably at least 50 wt %.

Electron Injection Material

Any known electron injection material may be used, LiF being typical. Other possibilities include $BaF_2$, $CaF_2$ and CsF, $TbF_3$ and rare earth fluorides.

Cathode

The cathode can be any low work function metal, e.g., aluminum, calcium, lithium, silver/magnesium alloys etc. In many embodiments, aluminum is used as the cathode either on its own or alloyed with elements such as magnesium or silver, although in some embodiments other cathode materials e.g. calcium may be employed. In an embodiment the cathode may comprise a first layer of alloy e.g. Li—Ag, Mg—Ag or Al—Mg closer to the electron injection or electron transport layer and an second layer of pure aluminum further from the electron injection or electron transport layer.

The present invention is further described with reference to the following examples.

Example 1

Synthesis of 1-phenyl-3-methyl-4-trimethylacetyl pyrazol-5-one (TMAP) from 1-phenyl-3-methylpyrazol-5-one 1-phenyl-3-methylpyrazol-5-one (25.0 g) was dissolved with warming in 235.3 ml of dioxane in 500 ml 3-neck quick-fit round bottom flask carrying a reflux condenser, a dropping funnel and stirrer. The solution was cooled to room temperature. 29.4 g of dry calcium hydroxide was added to the solution and stirred. 17.7 ml of trimethylacetyl chloride was added dropwise to the mixture in the flask with vigorous stirring within 15 mm. The mole ratio of pyrazolone and trimethylacetyl chloride is 1:1. The hot reaction mixture was stirred without heating for 40 mm and resultant orange mixture was poured into 1176 ml of chilled 3 M HCl with stirring to decompose the calcium product. The product was extracted into $CH_2Cl_2$ and the solvent was evaporated to obtain the crude product. Then the pure product was isolated as reddish-brown solution using column chromatography eluted with diethyl ether-pet. ether (60-80° C.) (3:2). The solvent mixture was evaporated and oily product was kept in refrigerator to solidify. mp 98° C. Elemental analysis of the product. Found: C, 69.47%; H, 7.00%; N, 10.69%. Cal. for ($Cl_5H{\sim}_8N_2O_2$): C, 69.76%; H, 6.98%; N, 10.85%.

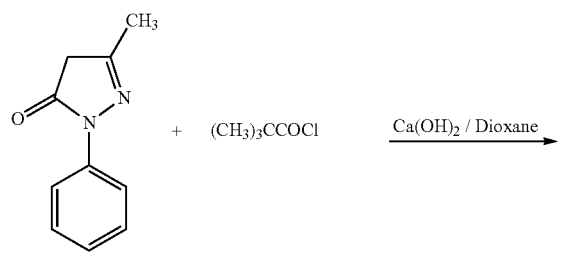

Example 2

Synthesis of 4-tert-Butyl-3-methyl-1-phenylpyrazol-5-one

3-Methyl-1-phenylpyrazol-5-one (5 g; 0.029 mole) was placed in a flask equipped with a stirrer and reflux condenser. Dry and distilled dioxane (40 ml) was added by warming and to the clear solution calcium hydroxide (6.4 g; 0.086 mole) was added followed by drop wise addition of tert-butylacetyl chloride (4.8 ml; 0.034 mole). The mixture was heated to reflux for 4 hours and then poured into 2M HCl (200 ml) to decompose the calcium complex. A light brown precipitate formed immediately, which was filtered off under suction after refrigerating overnight. The product washed with water and dried under vacuum at 50° C. The product was recrystalised from methanol to give an off-white crystalline solid, m.p 85-86° C.; 6.8 g (82%).

| Elemental Analysis | | | |
|---|---|---|---|
| Element | C | H | N |
| % Theory | 70.56 | 7.40 | 10.28 |
| 5 Found | 70.54 | 7.43 | 10.26 |

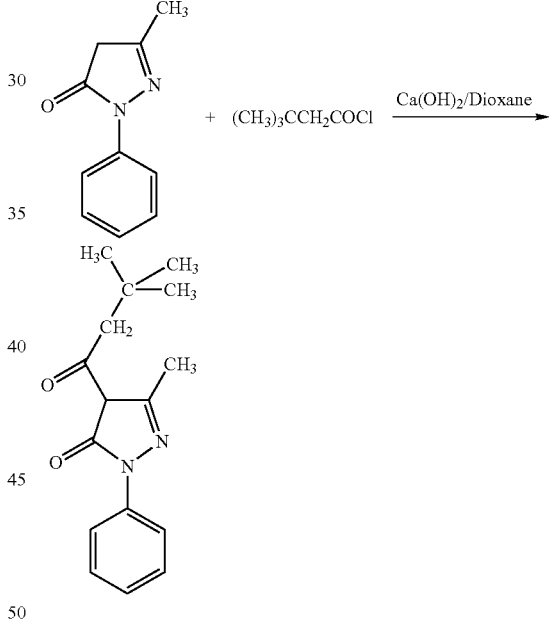

Example 3

Synthesis of Aluminum(1-phenyl-3-methyl-4-trimethylacetyl pyrazol-5-one)$_3$ Complex Al(TMAP)$_3$ A solution of 1-phenyl-3-methyl-4-trimethylacetyl pyrazol-5-one (TMAP) (3.9 mM) in ethanol (15 ml) was stirred and neutralised with sodium hydroxide (NaOH) (3.9 mM in 2 ml $H_2O$) solution. To the mixture was added $AlCl_3.6H_2O$ (1.3 mM in 2 ml $H_2O$) dropwise at room temperature. Then the mixture was stirred for 5 minutes at room temperature and then warmed for another 5 minutes. The crude product, which simultaneously precipitated from the solution, was collected by filtration and washed with water and ethanol. It was dried at 65° C. for 5 hours. mp 298° C. Elemental analysis of Al complex.

Found: C, 66.64%; H, 6.37%; N, 10.22%. Cal. for Al (C$_{45}$H$_{54}$N$_6$O$_6$) complex: C, 67.66%; H, 6.39%; N, 10.52%.

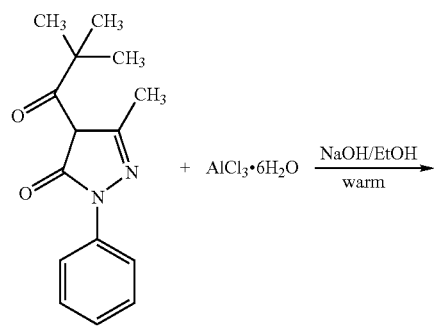

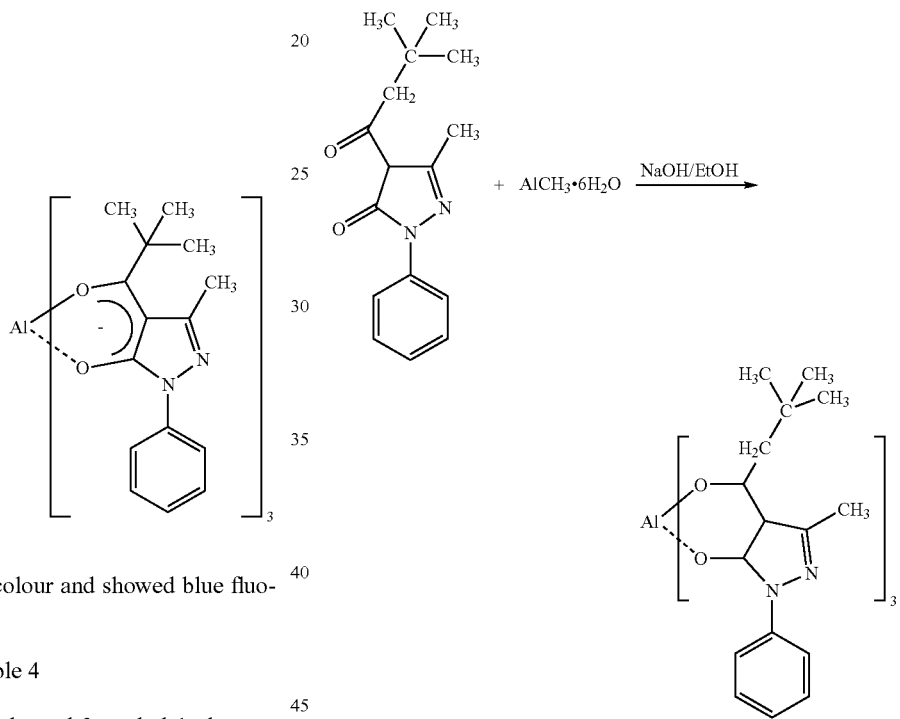

The product is a light-pink colour and showed blue fluorescence.

Example 4

Synthesis of Tris(4-tert-butylacetyl-3-methyl-1-phenylpyrazol-onato), Al(pyr)$_3$ 4-tert-Butylacetyl-3-methyl-1-phenylpyrazol-5-one (2.0 g; 0.0074 mole) was dissolved in ethanol (25 ml) and to the stirred solution added aluminum chloride hexahydrate (0.6 g; 0.0025 mole) in water (5 ml). A precipitate formed within 5 minutes. The reaction mixture was stirred at room temperature for 18 hours and filtered off under suction. The product washed thoroughly with de-ionised water and ethanol and dried under vacuum at 70° C. for 10 hours, 1.85 g (53%). M.p 236.5-237° C.

| Elemental Analysis | | | | |
|---|---|---|---|---|
| Element | C | H | N | Al |
| % Theory | 68.55 | 6.83 | 9.99 | 3.21 |
| % Found | 68.97 | 6.89 | 10.01 | 3.26 |

Thermal Analysis:

DSC analysis showed an onset melting point of 231° C. and the peak melting at 236° C. IR (KBr) spectra showed major absorptions appearing at 2943, 1607, 1488, 1431, 1080 and 753 cm$^{-1}$. The compound showed a blue fluorescence under UV lamp.

PL Measurement:

PL spectra was measured by Lot Oriel Multispec Model 77400 CCD Camera. A The measurement was carried out from the powder by spreading the powder on a spectrosil plate.

PL efficiency: 0.034 cd m$^{-2}$ μlW$^{-1}$

Colour co-ordinates: x 0.19; y 0.21

Peak maximum: 450 nm (FWHM ~110 nm).

Example 5

By the methods of Examples 1 and 3 the aluminium pyrazolones in below were synthesized.

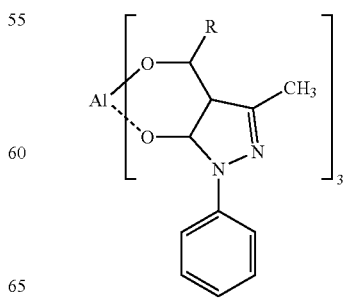

where R is as in the Table 1.

TABLE 1

| Compound | M.pt (° C.) | PL efficiency cd m$^{-2}$μW$^{-1}$ | Colour co-ord (x; y) | Comments |
|---|---|---|---|---|
| R = 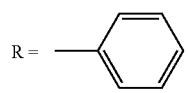 | 142 | 0.011 | 0.24; 0.34 | Peak maximum ~500 nm. |
| R = 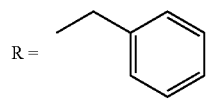 | 160 | 0.009 | 0.22; 0.25 | Peak maximum ~460 nm |
| R = 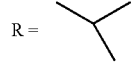 | 243-244 | 0.007 | 0.20; 0.21 | Peak maximum ~450 nm |
| R = 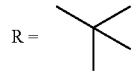 | 236.5-237 | 0.034 | 0.19; 0.21 | |
| R = 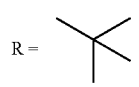 | 236 | | 0.19; 0.21 | Peak maximum ~450 nm. |
| R = CH$_3$ | | 0.01 | 0.21; 0.26 | |
| R = CH$_2$CH$_3$ | 182 | 0.01 | 0.20; 0.21 | |
| R = 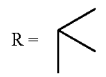 | | 0.009 | 0.24; 0.31 | Elemental analysis satisfactory. |

The PL Efficiencies were measured as in example 4.

Example 6

Device Fabrication

An ITO coated glass piece (1×1 cm$^2$) had a portion etched out with concentrated hydrochloric acid to remove the ITO and was cleaned and dried. The device was fabricated by sequentially forming on the ITO, by vacuum evaporation, layers comprising:—

Figure 2:
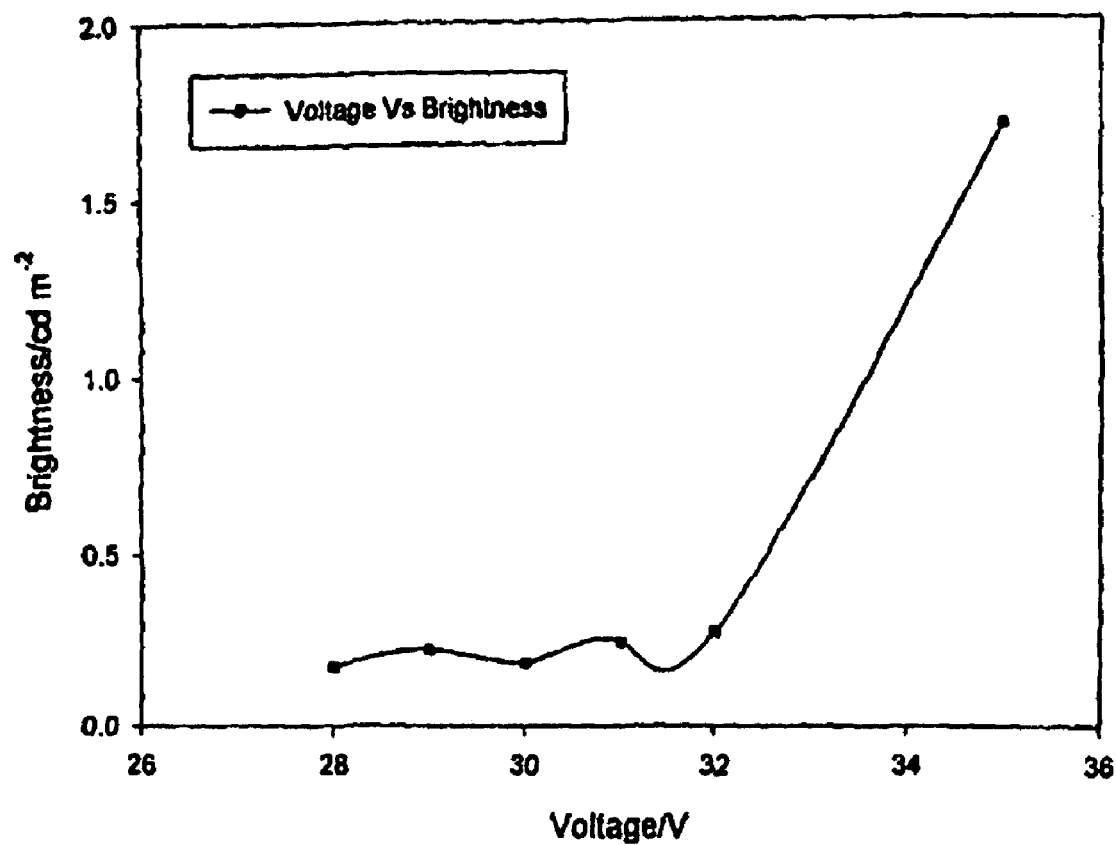
Figure 3:
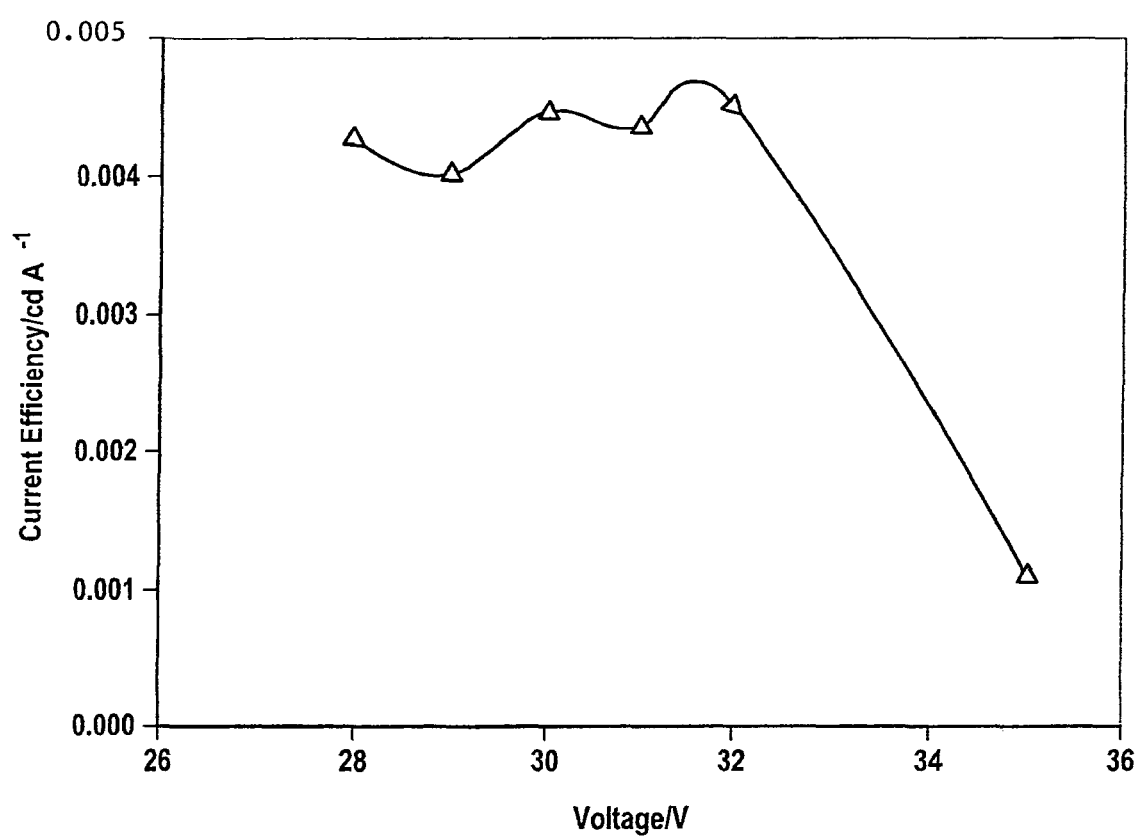
Figure 4:
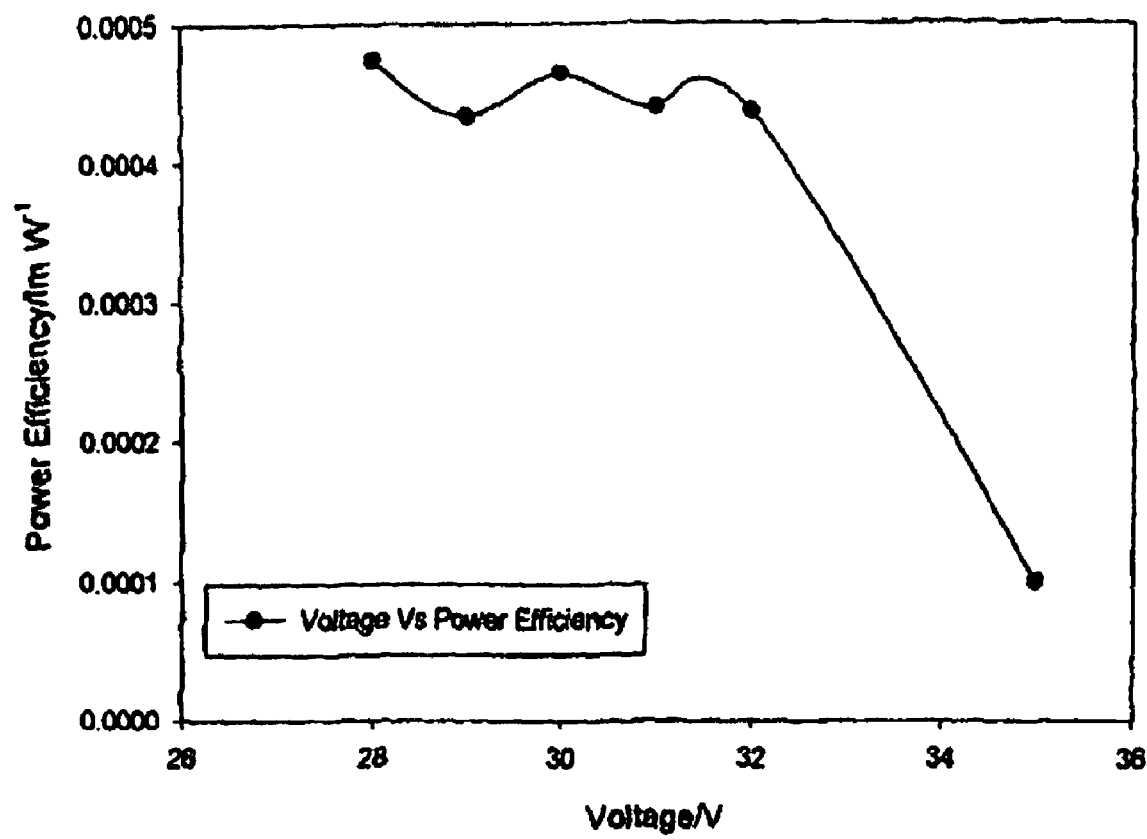
Figure 5:
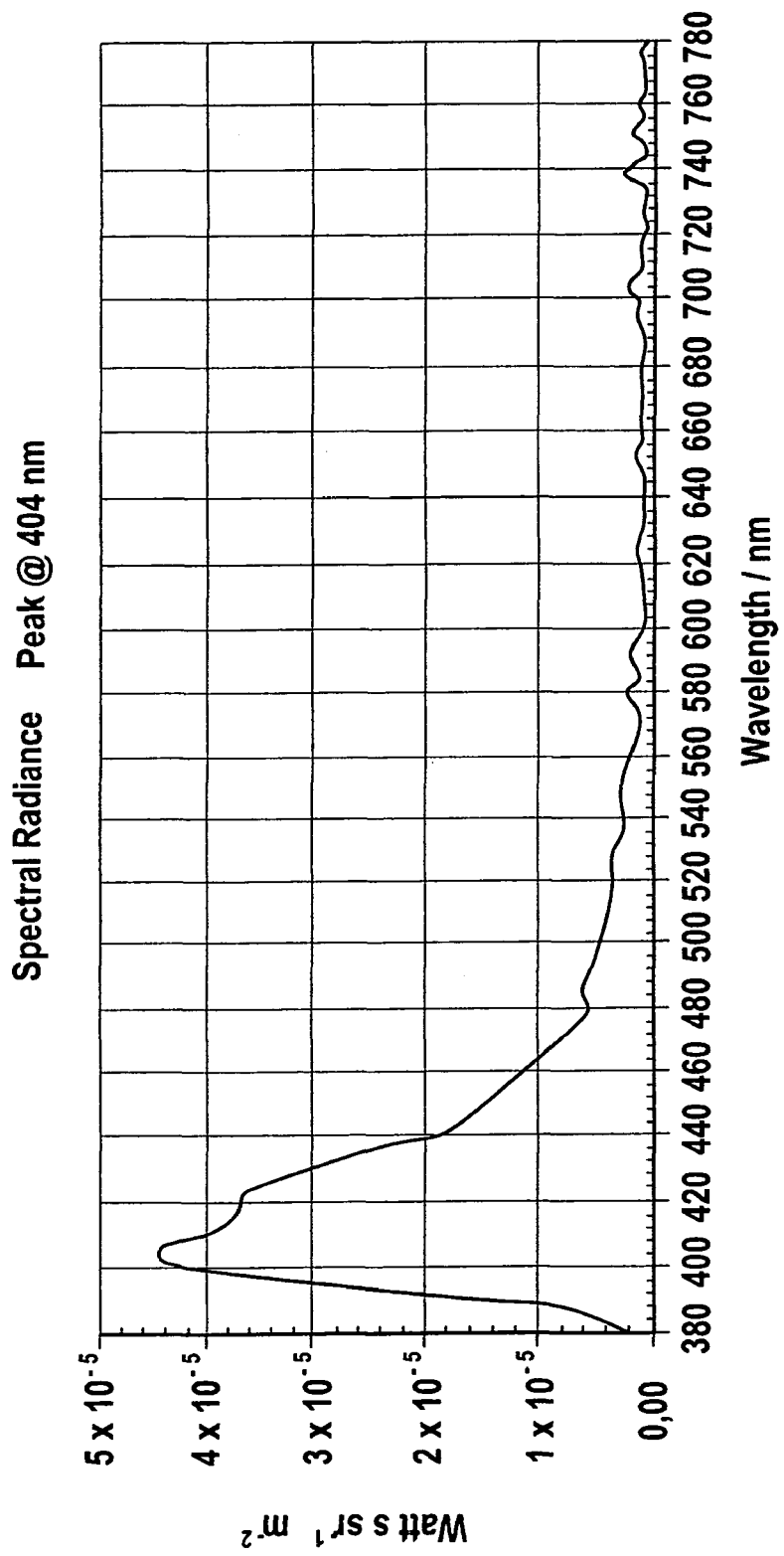

ITO(100 Ω/sqr.m)/CuPc(2.5 mg; ~7.8 nm)/TPD (10.4 mg; ~44.8 nm)/Al(TMAP)$_3$(10.6 mg; ~61.6)nm)/ LiF(0.59 mg; ~2.7 nm)/Al where ITO is indium titanium oxide coated glass Cu Pc is copper phthalocyanine and TPD is as defined in the specification. The organic coating on the portion which had been etched with the concentrated hydrochloric acid was wiped with a cotton bud. The coated electrodes were stored in a vacuum desiccator over a molecular sieve and phosphorous pentoxide until they were loaded into a vacuum coater (Edwards, 10$^{-6}$ torr) and aluminum top contacts made. The active area of the LED's was 0.08 cm by 0.1 cm$^2$ the devices were then kept in a vacuum desiccator until the electroluminescence studies were performed. The ITO electrode was always connected to the positive terminal. The current vs. voltage studies were carried out on a computer controlled Keithly 2400 source meter. An electric current was applied across the device and a plot of the current versus voltage is shown in the graph of FIG. 1, a plot of brightness against voltage shown in FIG. 2, a plot of current efficiency against voltage shown in FIG. 3, a plot of power efficiency against voltage shown in FIG. 4, the electroluminescence spectrum is shown in FIG. 5.

Example 7

A structure comprising

Figure 6:
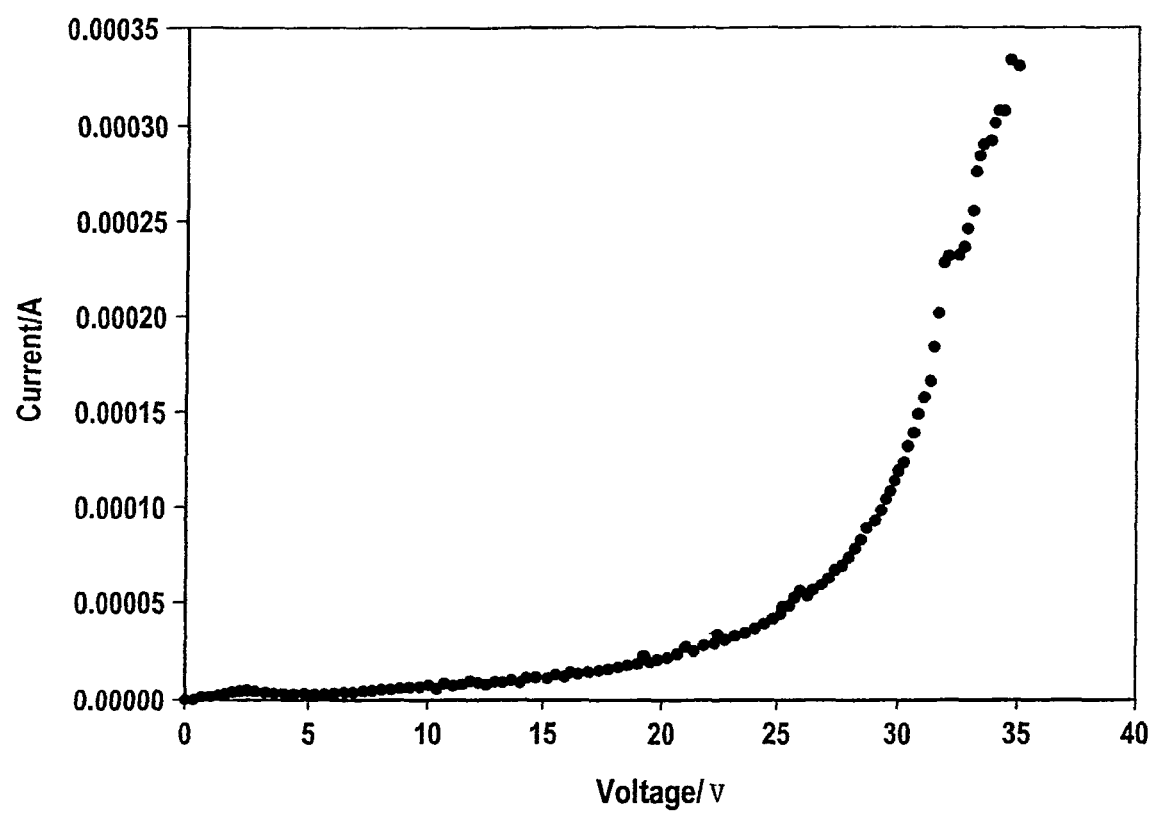
FIG. 6 is a plot of current against voltage for the device of Example 7 below.

ITO(100 Ω/sq.m)/CuPc(3 mg; ~9.6 nm)/β-NPD(2.8 mg; ~24.4 nm)/Al(TMAP)$_3$ (9.6 mg; ~60.2 nm)/ LiF(0.6 mg; ~2.1 nm)/Al was fabricated as in example 6 and the characteristics shown in FIG. 6.

Example 8

A structure comprising

Figure 7:
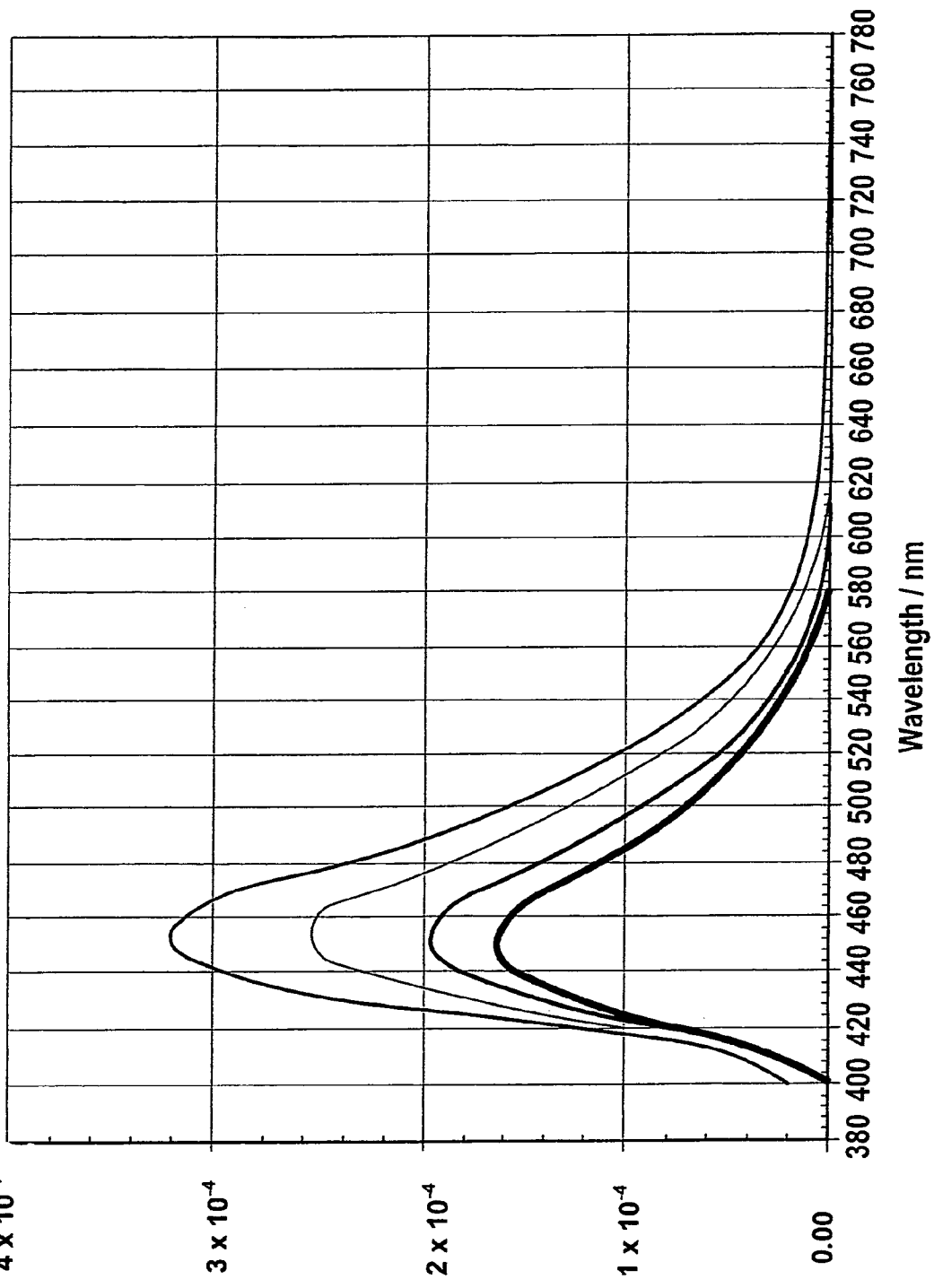
FIG. 7 shows electroluminescence spectra for the device of Example 8 below.

ITO(100 Ω/sq.m)/α-NPB(30 nm)/Al(pyr)$_3$(30 nm)/ Alq$_3$(20 nm)/Al was fabricated as in example 6 where the Al(pyr)$_3$ and was made as in example 4; the electroluminescent spectra at different voltages shown in FIG. 7, where

| Voltage/V | Current/mA | Luminance/cdm$^{-2}$ | x | y | J/mAcm$^{-2}$ | $\eta_l$/cdA$^{-1}$ | $\eta$EL/lmW$^{-1}$ |
|---|---|---|---|---|---|---|---|
| 25.00 | 0.02 | 1.70 | 0.15 | 0.13 | 0.30 | 0.57 | 0.07 |
| 27.00 | 0.03 | 1.80 | 0.15 | 0.13 | 0.35 | 0.51 | 0.06 |
| 29.00 | 0.04 | 2.20 | 0.15 | 0.13 | 0.46 | 0.48 | 0.05 |
| 31.00 | 0.06 | 3.70 | 0.16 | 0.14 | 0.76 | 0.49 | 0.05 |
| 33.00 | 0.06 | 3.10 | 0.16 | 0.14 | 0.71 | 0.44 | 0.04 |

The x and y co-ordinates are those on the CIE Colour Chart

Figure 8:
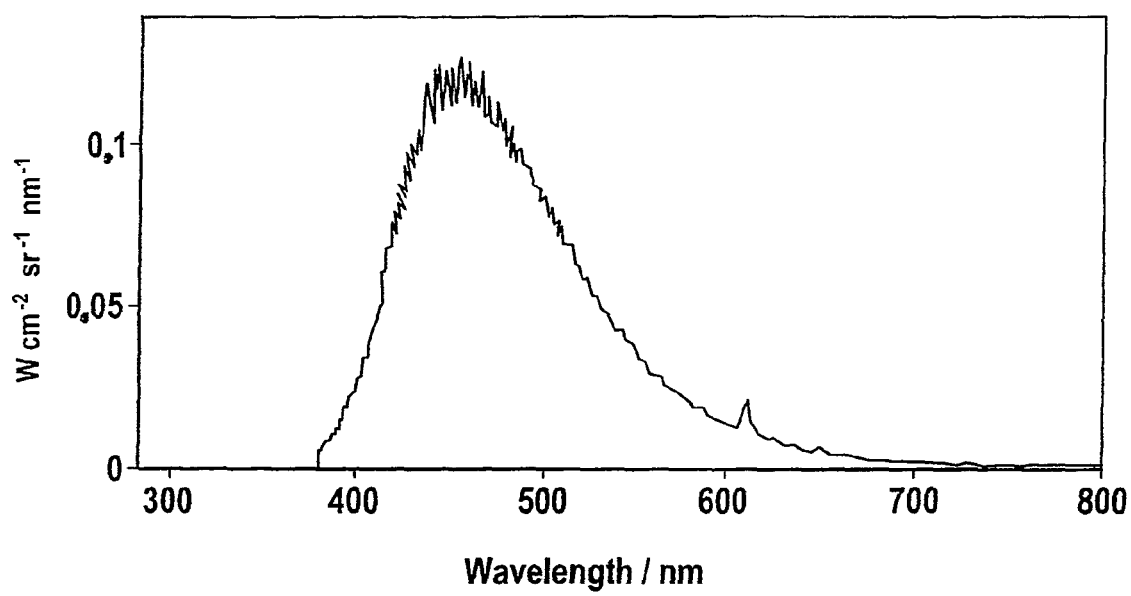
FIG. 8 is a further electroluminescence spectrum.
Figure 9:
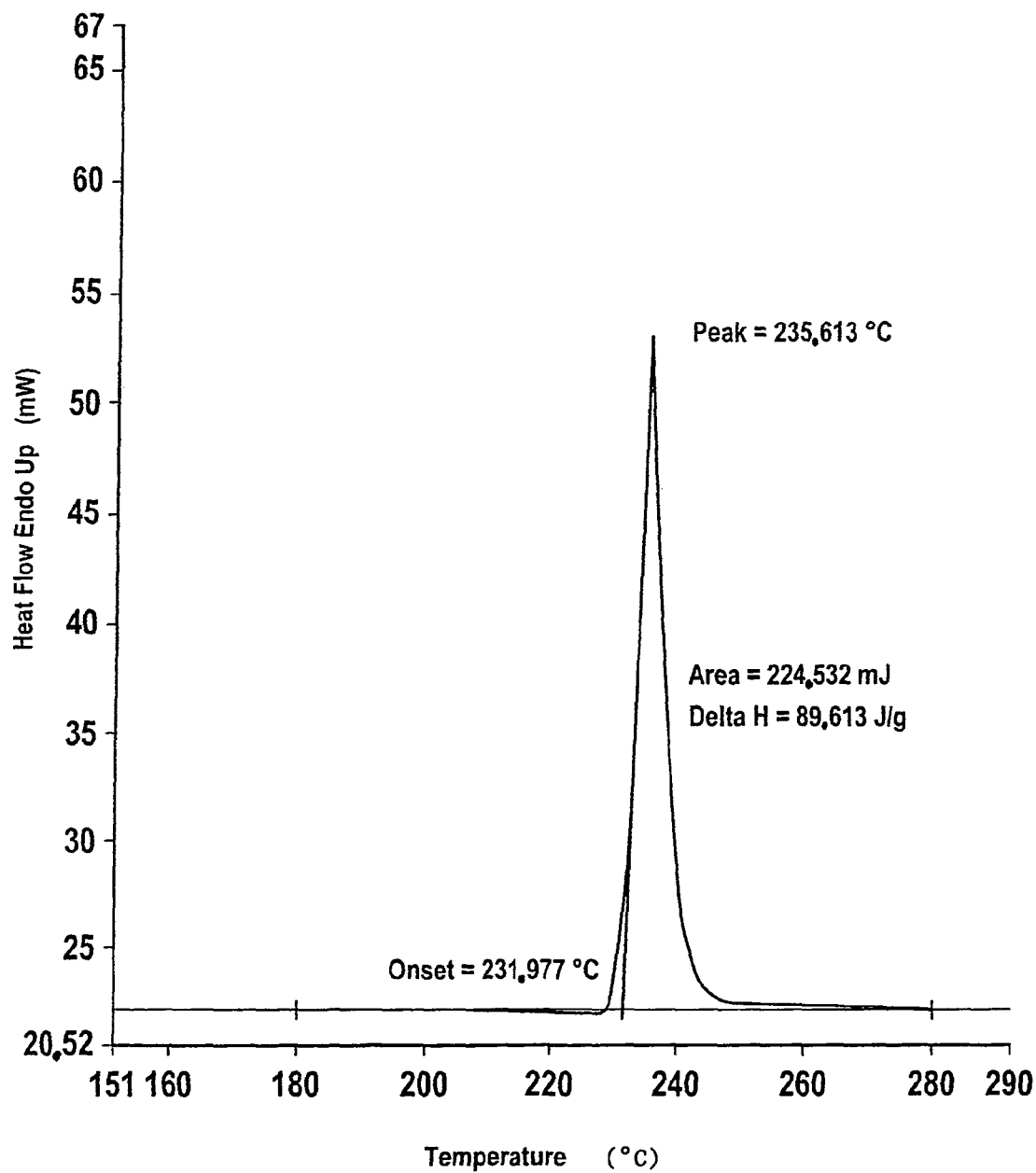
FIG. 9 is a graph showing heat flow characteristics.

An electroluminescent spectrum is shown in FIG. 8 and the heat flow characteristics using a PerkinElmer Thermal analysis are shown in FIG. 9 in which the heating was from 50 to 300° C. at 40° C./min and cooling 300 to 50° C./min.

Example 9

A structure comprising

ITO(10 Ω/sq.m)/CuPc(8 nm)/α-NPB(60 nm)/Al(pyr)$_3$
(30 nm)/Alq$_3$(10 nm)/LiF(0.7 nm)/Al was fabricated as in example 6 where the Al(pyr)$_3$ and was made as in example 4 and CuPc is a copper phthalocyanine buffer layer and LiF is lithium fluoride. The electroluminescence characteristics were measured and the results shown in Table 2.

TABLE 2

| Voltage (V) | Current (mA) | Luminance (cd m$^{-2}$) | Colour Co-ordinate | | Current Efficiency (cd A$^{-1}$) | Memory ID |
|---|---|---|---|---|---|---|
| | | | x | y | | |
| 7 | 0.16 | 0.33 | 0.16 | 0.11 | 0.21 | |
| 8 | 0.52 | 1.51 | 0.15 | 0.10 | 0.29 | |
| 9 | 1.72 | 5.48 | 0.15 | 0.10 | 0.32 | |
| 11 | 8.7 | 28.9 | 0.15 | 0.10 | 0.32 | M5 |
| 12 | 13.9 | 40.7 | 0.15 | 0.10 | 0.29 | M6 |
| 12.5 | 16.12 | 46 | 0.15 | 0.10 | 0.29 | |
| 13 | 19.3 | 54.1 | 0.15 | 0.10 | 0.28 | |
| 13.5 | 23.5 | 62.3 | 0.15 | 0.10 | 0.26 | |
| 14 | 27.9 | 71.6 | 0.15 | 0.10 | 0.26 | |
| 14.5 | 32.3 | 82 | 0.15 | 0.10 | 0.25 | |
| 15 | 36.2 | 91.3 | 0.15 | 0.10 | 0.25 | |
| 15.5 | 42.5 | 100.7 | 0.15 | 0.10 | 0.24 | |
| 16 | 46.5 | 107.5 | 0.15 | 0.10 | 0.23 | M7 |
| 16.5 | 51.3 | 117.1 | 0.15 | 0.10 | 0.23 | |
| 17 | 57.6 | 94.31 | 0.15 | 0.10 | 0.16 | |

Figure 10:
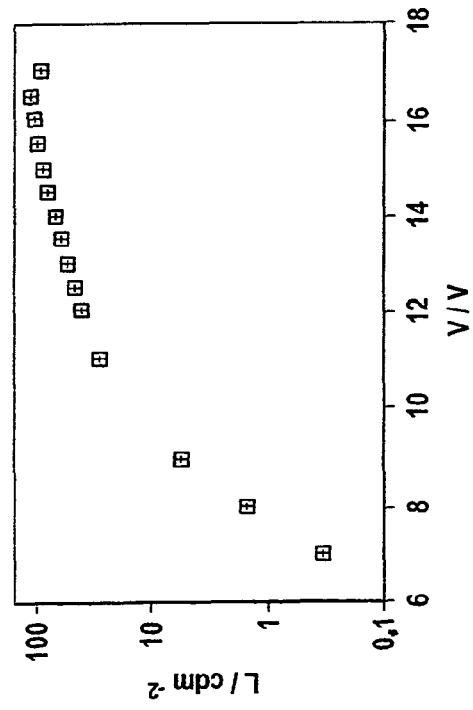
FIGS. 10 and 11 are sets of graphs showing the electroluminescence properties of the devices of Examples 9 and 10 below.
Figure 10:
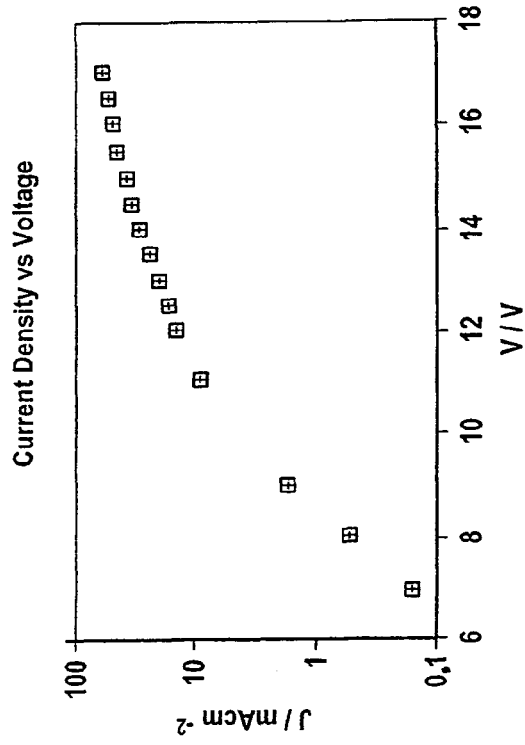
Figure 10:
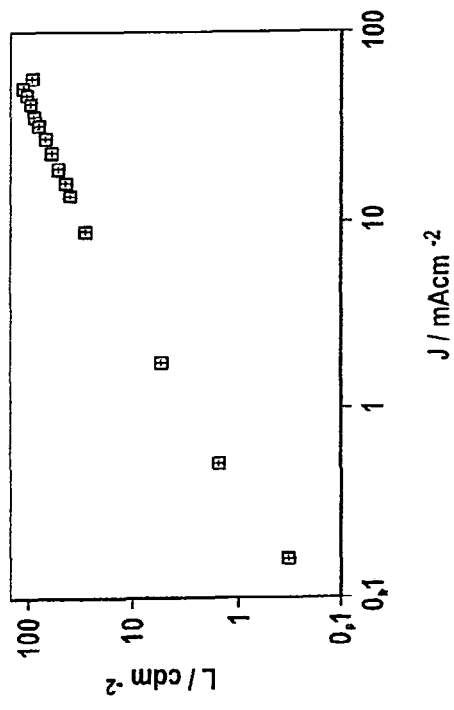
Figure 10:
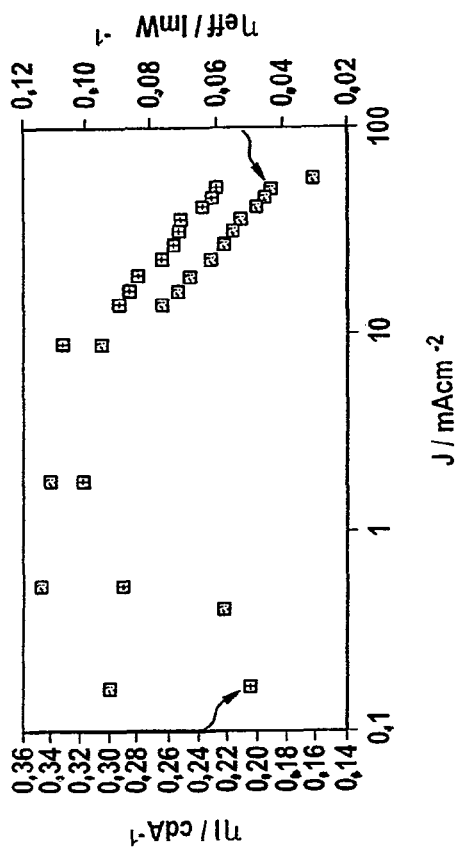

The properties are shown in graphical form in FIG. 10

Example 10

A structure comprising

Figure 11:
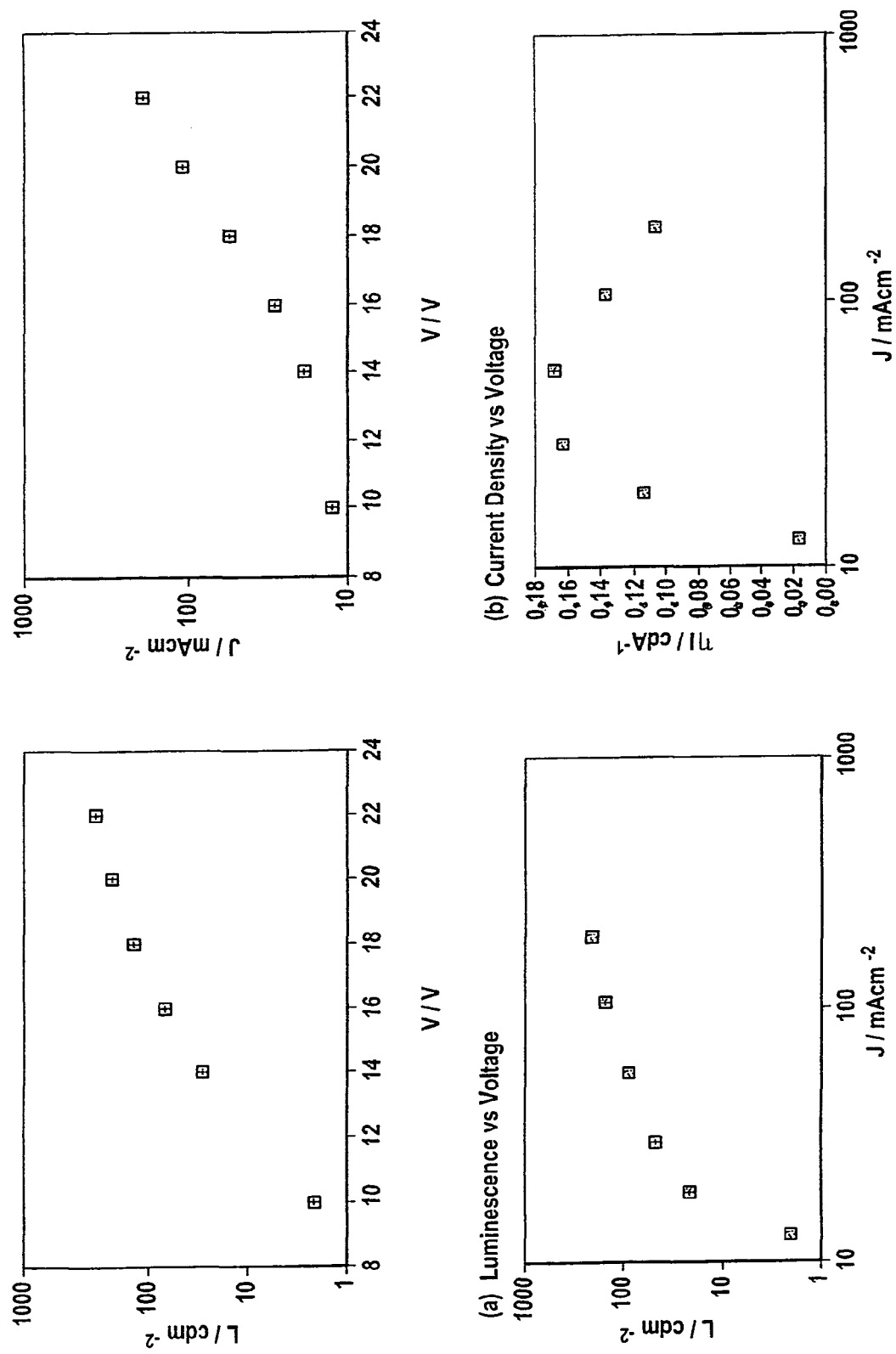

ITO(10 Ω/sq.m)/CuPc(8 nm)/α-NPB(60 nm)/Al
(DBM)$_3$(30 nm)/Alq$_3$(10 nm)/LIF(0.7 nm)/Al was fabricated as in example 6 where the Al(pyr)$_3$ and was made as in example 4 Al(DBM)$_3$ is aluminum CuPc is a copper phthalocyanine buffer layer and LiF is lithium fluoride. The properties are shown in FIG. 11

Example 11

A structure comprising

ITO(10 Ω/sq.m)/CuPc(8 nm)/α-NPB(60 nm)/Al(pyr)$_3$
(30 nm)/Liq(10 nm)/LiF(0.7 nm)/Al was fabricated as in example 6 where the Al(pyr)$_3$ and was made as in example 4, Liq is lithium quinolate, CuPc is a copper phthalocyanine buffer layer and LiF is lithium fluoride. The electroluminescence properties are shown in Table 3

TABLE 3

Figure 12:
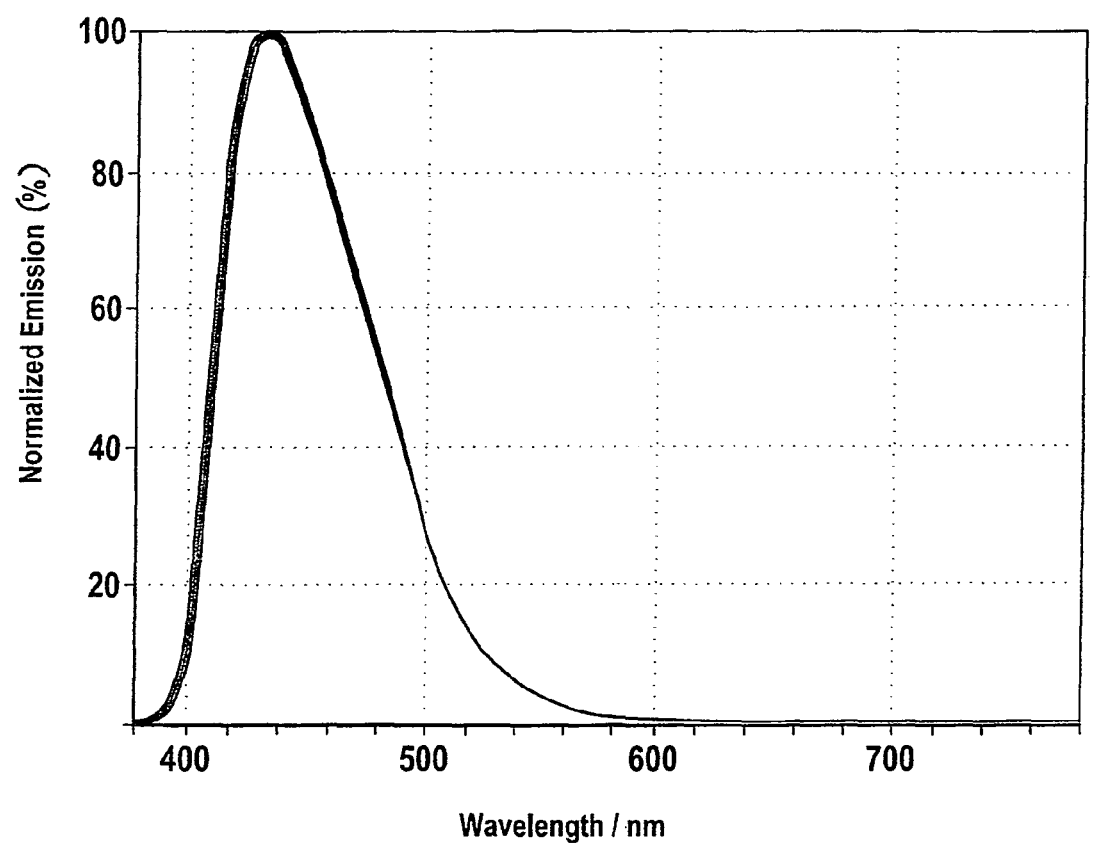
FIG. 12 is a relative spectral distribution graph for the device of Example 11 below.

| Voltage/V | Current/mA | Luminance/cdm$^{-2}$ | x | y | J/mAcm$^{-2}$ | $\eta_l$/cdA$^{-1}$ | $\eta_{EL}$/lmW$^{-1}$ |
|---|---|---|---|---|---|---|---|
| 9 | 4.9 | 0.88 | 0.15 | 0.11 | 61.25 | $1.44 \times 10^{-3}$ | $5.02 \times 10^{-4}$ |
| 10 | 7.09 | 1.77 | 0.15 | 0.10 | 88.63 | $2.00 \times 10^{-3}$ | $6.27 \times 10^{-4}$ | and the relative spectral distribution shown in FIG. 12.

Example 12

A device was fabricated comprising:

ITP/CuPc(25)/α-NBP(70)/Compound A:perylene(30: 0.1)Zrq₄(20)/LiF(0.2)/Al, wherein compound A is

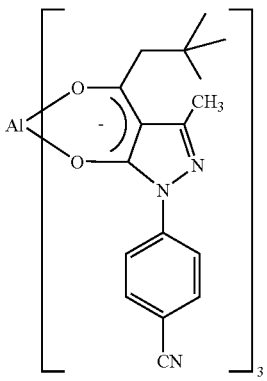

Figure 13:
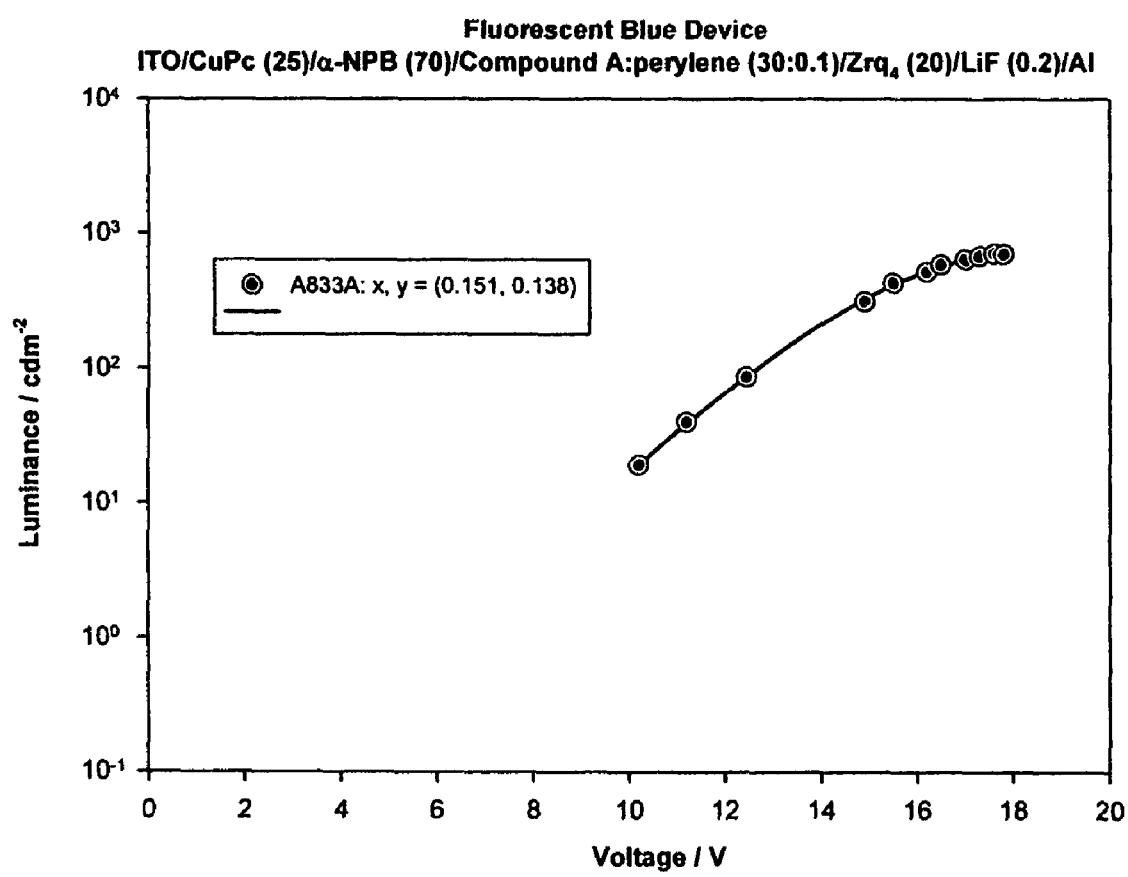
FIGS. 13-15 are graphs of luminance against voltage, current efficiency against luminance, and power efficiency against luminance, respectively, for the device of Example 12.
Figure 14:
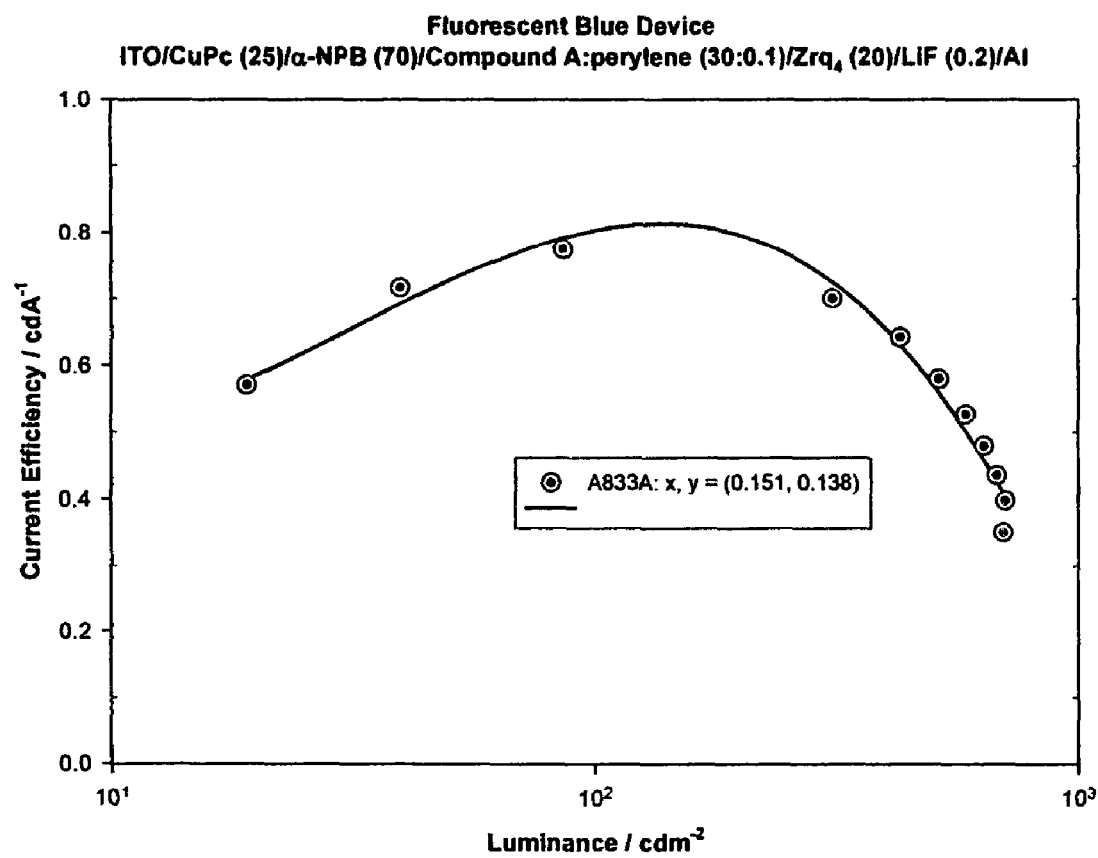
Figure 15:
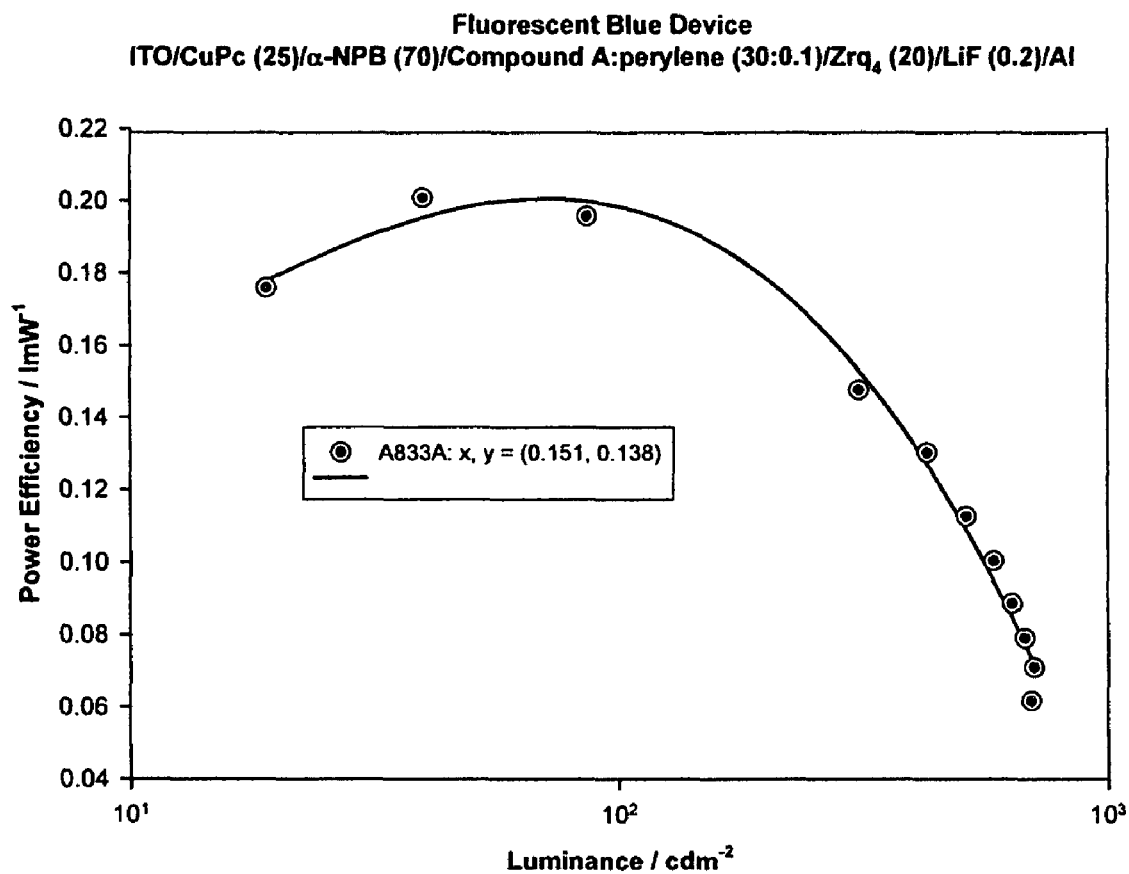

Properties of the device are shown in FIGS. 13-15.

Example 13

A device was fabricated of structure:

ITO/CuPc(25)/α-NPB(90)/Compound A:coumarin 440(30: 0.2)/Zrq4(20)/LiF(0.5)/Al.

Its performance data was as follows:

Performance Data:

| Voltage (V) | Brightness (cdm$^{-2}$) | x | y | Current Efficiency (cdA$^{-1}$) |
|---|---|---|---|---|
| 14 | 258 | 0.15 | 0.12 | 0.39 |

We claim:

1. An electroluminescent device which comprises:
   (i) a first electrode;
   (ii) a second electrode; and,
   (iii) between said first electrode and said second electrode, a layer of an electroluminescent material comprising a compound of formula (I) below

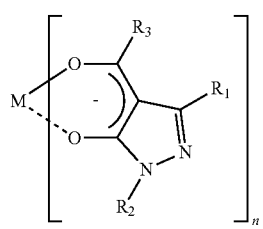

and a fluorescent or phosphorescent dopant;

wherein, in formula (I),

M is lithium, sodium, potassium, rubidium, cesium, beryllium, magnesium, calcium, strontium, barium, copper, silver, gold, zinc, boron, aluminum, gallium, indium, germanium, tin, antimony, lead, manganese, iron, ruthenium, osmium, cobalt, rhodium, iridium, nickel, palladium, platinum, cadmium or chromium;

n is the valence of M; and $R_1$, $R_2$ and $R_3$ can be the same or different, and are selected from hydrogen, a substituted or unsubstituted aliphatic group, a substituted or unsubstituted aromatic, heterocyclic or polycyclic ring structure, a fluorocarbon, a halogen or a nitrile group.

2. The device of claim 1, in which M is aluminum, $R_1$ is methyl, $R_2$ is phenyl and $R_3$ is a methyl, ethyl, 2,2-dimethylpropyl, iso-butyl, tert-butyl, benzyl, ethylphenyl, or fluorobenzyl group.

3. The device of claim 1 in which $R_3$ is selected from methyl, ethyl, propyl, butyl and pentyl groups.

4. The device of claim 1 in which there is a layer of a hole transmitting material between the first electrode and the layer of electroluminescent material.

5. The device of claim 1 in which there is a layer of electron transmitting material between the second electrode and the layer of electroluminescent material.

6. The device of claim 1 in which:
   (i) a layer of a hole transmitting material is located between the first electrode and the layer of the electroluminescent material; and
   (ii) a layer of an electron transmitting material is located between the second electrode and the layer of electroluminescent material.

7. The device of claim 6 in which the hole transmitting layer is formed from a material selected from the group consisting of:
   a poly(vinylcarbazole);
   a substituted or unsubstituted polyaniline;
   N,N'-diphenyl-N,N'-bis(3-methylphenyl)-1,1'-biphenyl-4,4'-diamine (TPD);
   poly(p-phenylenevinylene)-PPV and copolymers including PPV;
   poly(2,5-dialkoxyphenylene vinylene);
   poly(2-methoxypentyloxy)-1,4-phenylene vinylene);
   a polyfluorene or an oligofluorene;
   a polyphenylene or an oligophenylene;
   a polyanthracene or an oligoanthracenes; and,
   a polythiophene or an oligothiophene.

8. The device of claim 6 in which the electron transmitting material is a metal quinolate or aluminum or scandium dibenzoyl methane.

9. The device of claim 8 in which the electron transmitting material is a metal quinolate selected from the group consisting of lithium, sodium, potassium, zinc, magnesium or aluminum quinolate.

10. The device of claim 6 in which the first and/or second electrode is formed on a substrate of crystalline silicon and a surface of the substrate is polished or smoothed to produce a flat surface prior to the deposition of electrode or electroluminescent material.

11. The device of claim 6 in which the first and/or second electrode is formed on a substrate of a non-planarised silicon substrate.

12. The device of claim 6 in which the hole transmitting layer is a copper phthalocyanine and the electron transmitting layer is lithium fluoride.

13. The device of claim 6 in which the hole transmitting layer is formed from a material selected from the group consisting of:
  a poly(2,5-dialkoxyphenylene vinylene) with at least one of the alkoxy groups being a long chain solubilising alkoxy group;
  poly(2-methoxy-5-(2-methoxypentyloxy-1,4-phenylene vinylene); and,
  poly(2-methoxy-5-(2-dodecyloxy-1,4-phenylene vinylene).

14. The device of claim 1 in which a hole transmitting material and the electroluminescent material are mixed to form one layer in a proportion ranging from about 5 to 95% of the hole transmitting material and correspondingly about 95 to 5% of the electroluminescent material.

15. The device of claim 1 in which an electron transmitting material and the electroluminescent material are mixed to form one layer in a proportion ranging from about 5 to 95% of the electron transmitting material and correspondingly about 95 to 5% of the electroluminescent material.

16. An electroluminescent device comprising:
  (i) a first electrode;
  (ii) a second electrode; and
  (iii) a layer of an electroluminescent material and a fluorescent or phosphorescent dopant positioned between said first and second electrodes, wherein said electroluminescent material is a compound selected from the group of compounds whose formulae are indicated below:

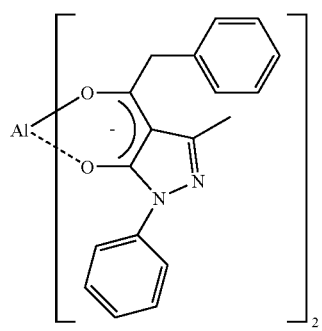

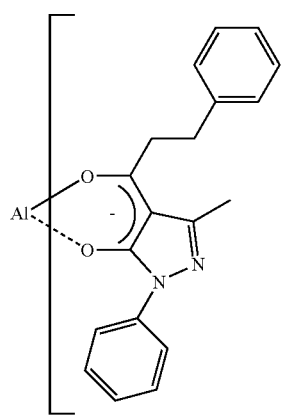

-continued

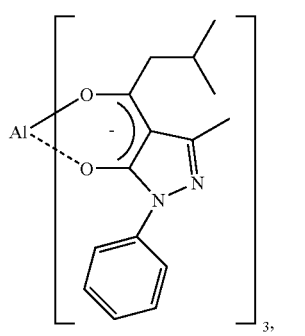

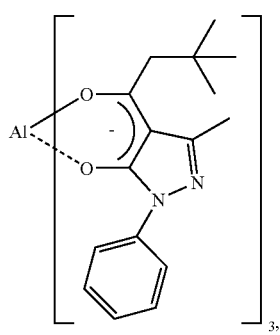

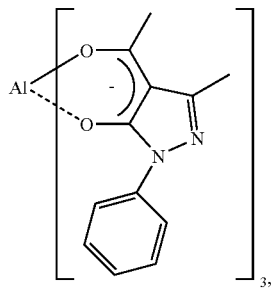

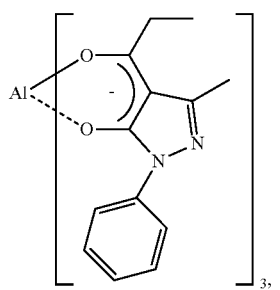

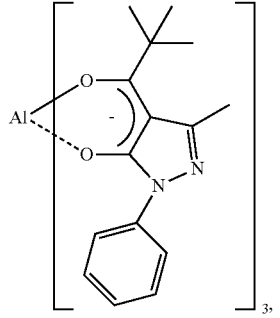

-continued

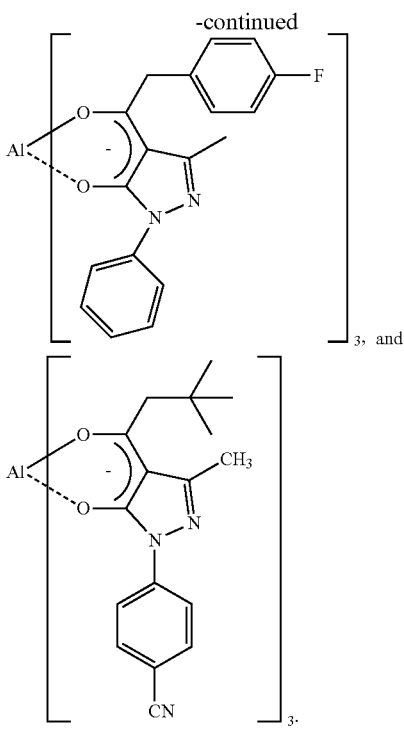

17. The device of claim 1, wherein the dopant is present in an amount of about 0.01 to 25% by weight of the combined weight of dopant and compound of formula (I).

18. The device of claim 1, wherein the dopant is present in an amount of about 0.01 to 2% by weight of the combined weight of dopant and compound of formula (I).

19. The device of claim 1, wherein the dopant is a fluorescent dopant.

20. The device of claim 1, wherein the dopant is a phosphorescent dopant.

21. The device of claim 1, wherein the dopant is a complex of a rare earth element.

22. The device of claim 1, wherein the dopant is a coumarin or coumarin derivative.

23. The device of claim 1, wherein the dopant is selected from the group consisting of:
compounds of chemical formula:

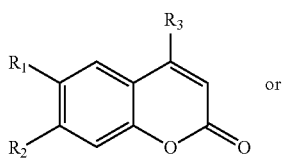

or

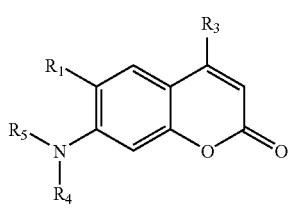

wherein $R_1$-$R_5$ represent hydrogen or alkyl, or any of the following compounds
3-(benzo[d]thiazol-2-yl)-8-(diethylamino)-2H-benzo[g]chromen-2-one,
3-(1H-benzo[d]imidazol-2-yl)-8-(diethylamino)-2H-benzo[g]chromen-2-one,
9-(pentan-3-yl)-1H-benzo[a]phenoxazin-5(4H,7aH,12aH)-one and
10-(2-benzothiazolyl)-1,1,7,7-tetramethyl-2,3,6,7-tetrahydro-1H,5H,11H-[1]benzo-pyrano[6,7,8-ij]quinolizin-11-one.

24. The device of claim 1, wherein the dopant is a fused-ring polycylic aromatic hydrocarbon having at least four rings.

25. The device of claim 1, wherein the dopant is perylene or a perylene derivative.

26. The device of claim 1, wherein the dopant is selected from perylene and perylene derivatives of the chemical formula

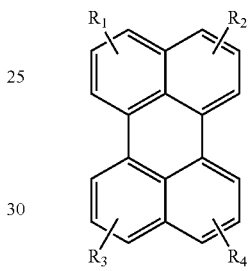

wherein $R_1$ to $R_4$ which may be the same or different are selected from hydrogen, hydrocarbyl groups, substituted and unsubstituted aromatic, heterocyclic and polycyclic ring structures, fluorocarbons, halogen, thiophenyl, substituted or unsubstituted fused aromatic, heterocyclic and polycyclic ring structures and copolymerizable monomer residues of formula —$CH_2$—$CH$=$CH$—R wherein R is hydrocarbyl, aryl, heterocyclic, carboxy, aryloxy, hydroxy, alkoxy, amino or substituted amino.

27. The device of claim 26, wherein $R_1$ to $R_4$ are selected from hydrogen and t-butyl.

28. The device of claim 1, wherein the dopant is selected from pyrene and pyrene derivatives of the chemical formula

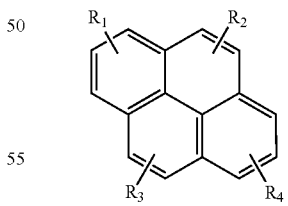

wherein $R_1$ to $R_4$ which may be the same or different are selected from hydrogen, hydrocarbyl groups, substituted and unsubstituted aromatic, heterocyclic and polycyclic ring structures, fluorocarbons, halogen, thiophenyl, substituted or unsubstituted fused aromatic, heterocyclic and polycyclic ring structures and copolymerizable monomer residues of formula —$CH_2$—$CH$=$CH$—R wherein R is hydrocarbyl, aryl, heterocyclic, carboxy, aryloxy, hydroxy, alkoxy, amino or substituted amino.

29. The device of claim 1, wherein the dopant is selected from compounds of the chemical formula below:

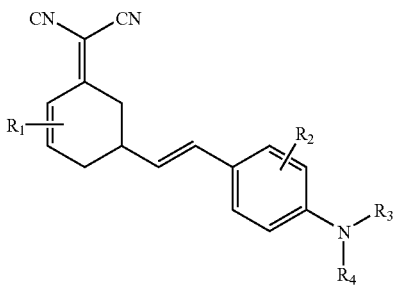

wherein $R_1$ represents alkyl, $R_2$ represents hydrogen or alkyl, $R_3$ and $R_4$ represent hydrogen, alkyl or six-membered ring structures fused to one another and to the phenyl ring at the 3- and 5-positions and optionally further substituted with one or two alkyl groups.

30. The device of claim 1, wherein the dopant is selected from compounds of the chemical formula below:

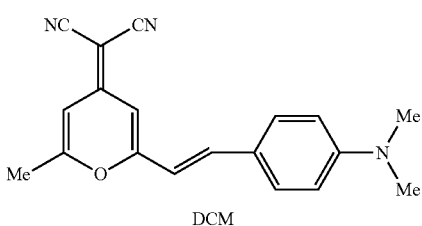
DCM

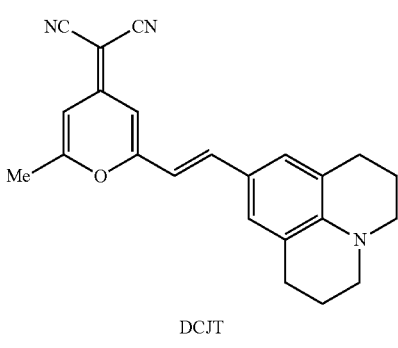
DCJT

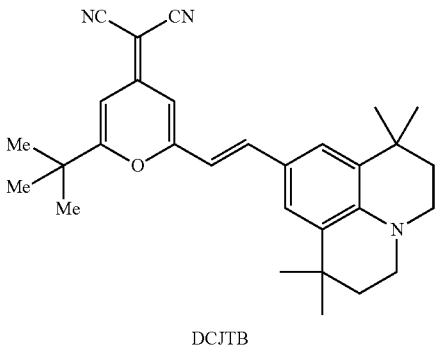
DCJTB

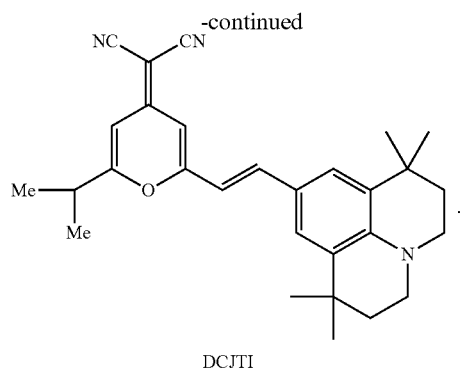
DCJTI

31. The device of claim 1, wherein the dopant is a complex of a general formula selected from:

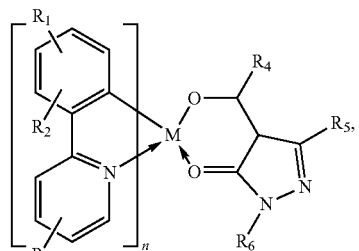

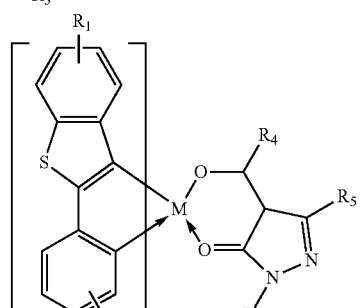

and

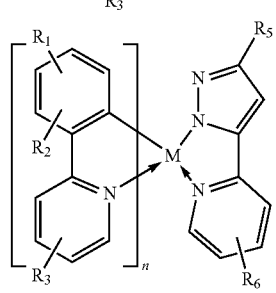

wherein
- $R_1$, $R_2$, and $R_3$ which may be the same or different are selected from the group consisting of hydrogen, alkyl, trifluoromethyl or fluoro; and
- $R_4$, $R_5$ and $R_6$ which can be the same or different are selected from the group consisting of hydrogen, alkyl or phenyl which may be unsubstituted or may have one or more alkyl, alkoxy, trifluoromethyl or fluoro substituents;
- M is ruthenium, rhodium, palladium, osmium, iridium or platinum; and
- n is 1 or 2.

32. The device of claim 1, wherein the dopant is a complex of a general formula selected from:

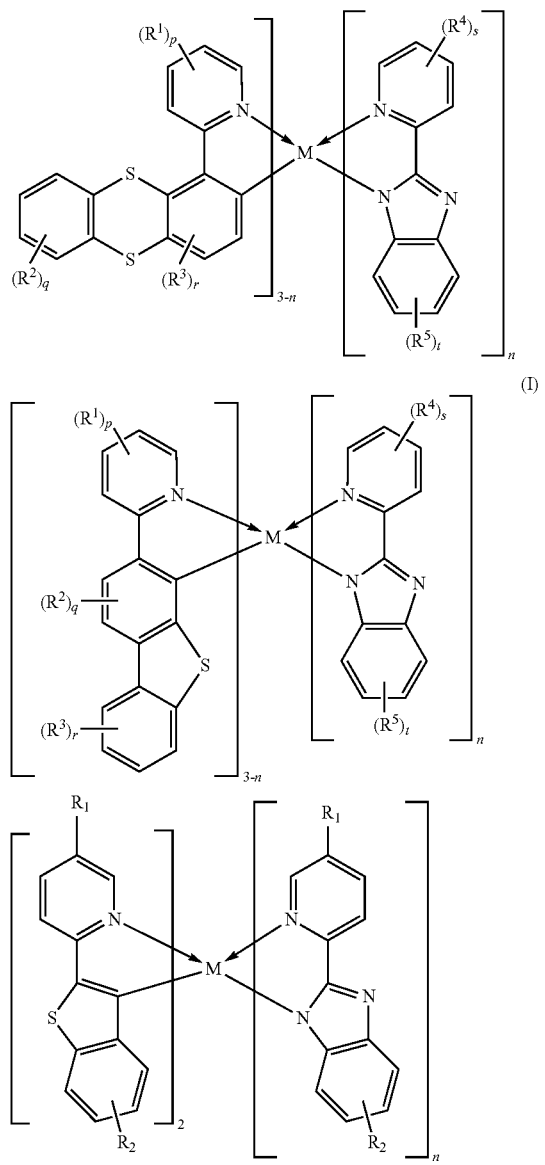

wherein
- M is ruthenium, rhodium, palladium, osmium, iridium or platinum;
- n is 1 or 2;
- $R_1$, $R_2$, $R_3$, $R_4$ and $R_5$ which may be the same or different are selected from the group consisting of hydrogen, hydrocarbyl, hydrocarbyloxy, halogen, nitrile, amino, dialkylamino, arylamino, diarylamino and thiophenyl;
- p, s and t are independently are 0, 1, 2 or 3, subject to the proviso that where any of p, s and t is 2 or 3 only one of them can be other than saturated hydrocarbyl or halogen;
- q and r are independently are 0, 1 or 2, subject to the proviso that when q or r is 2, only one of them can be other than saturated hydrocarbyl or halogen.

33. An electroluminescent composition comprising
(a) a compound of formula (I) below;

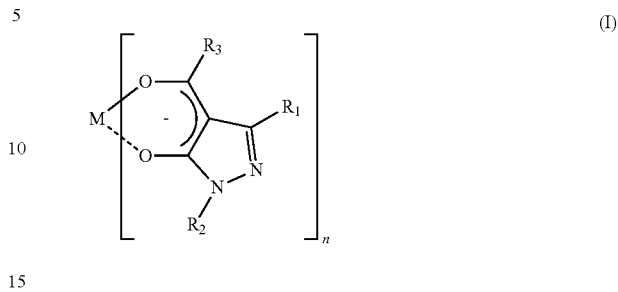

wherein M is lithium, sodium, potassium, rubidium, cesium, beryllium, magnesium, calcium, strontium, barium, copper, silver, gold, zinc, boron, aluminum, gallium, indium, germanium, tin, antimony, lead, manganese, iron, ruthenium, osmium, cobalt, rhodium, iridium, nickel, palladium, platinum, cadmium or chromium; n is the valence of M; and $R_1$, $R_2$ and $R_3$ can be the same or different, and are selected from hydrogen, a substituted or unsubstituted aliphatic group, a substituted or unsubstituted aromatic, heterocyclic or polycyclic ring structure, a fluorocarbon, a halogen or a nitrile group; and (b) a fluorescent or phosphorescent dopant.

34. The electroluminescent composition of claim 33 in which M is aluminum.

35. The electroluminescent composition of claim 33 in which the compound of formula (I) is selected from

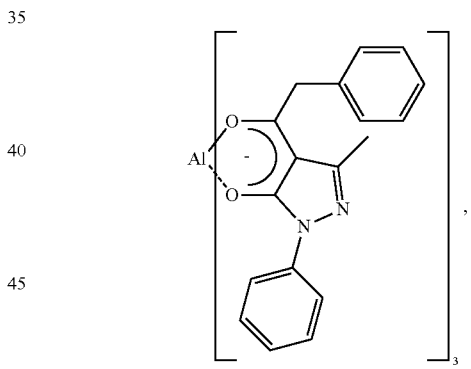

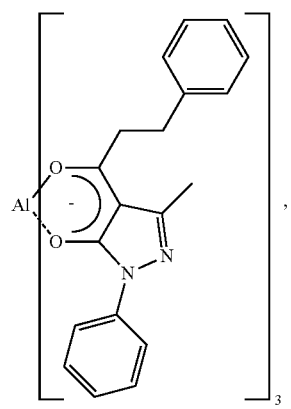

-continued

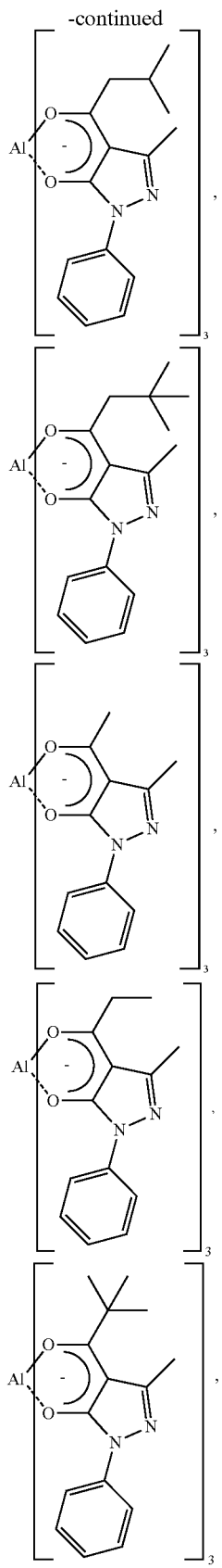

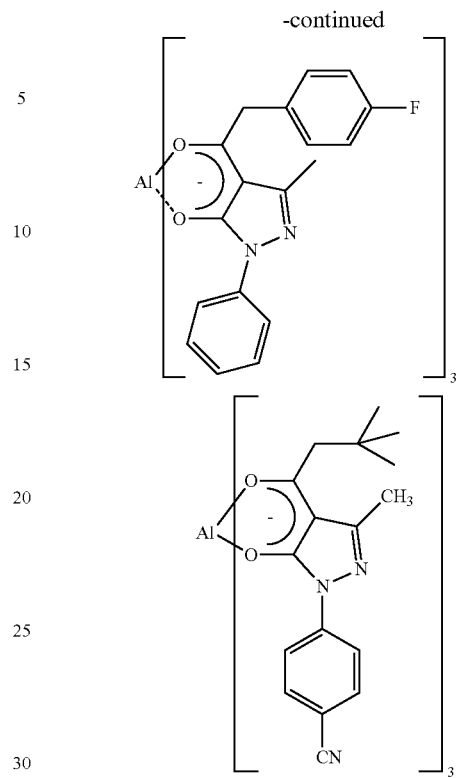

36. The electroluminescent composition of claim 33 in which the dopant is a coumarin or coumarin derivative.

37. The electroluminescent composition of claim 33 in which the dopant is perylene or a perylene derivative.

38. The electroluminescent composition of claim 33 in which the dopant is selected from compounds of the chemical formula below:

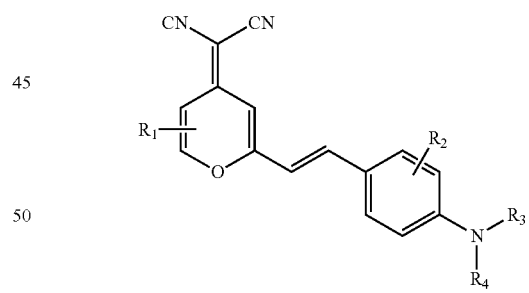

wherein $R_1$ represents alkyl, $R_2$ represents hydrogen or alkyl, $R_3$ and $R_4$ represent hydrogen, alkyl or six-membered ring structures fused to one another and to the phenyl ring at the 3- and 5-positions and optionally further substituted with one or two alkyl groups.

39. The electroluminescent composition of claim 33 in which the dopant is selected from organo-metallic complexes comprising a transition metal.

* * * * *

UNITED STATES PATENT AND TRADEMARK OFFICE
CERTIFICATE OF CORRECTION

PATENT NO. : 7,887,933 B2  
APPLICATION NO. : 11/796256  
DATED : February 15, 2011  
INVENTOR(S) : Poopathy Kathirgamanathan et al.

Page 1 of 3

It is certified that error appears in the above-identified patent and that said Letters Patent is hereby corrected as shown below:

Col. 35, line 57 (Claim 1): The notation "(I)" appearing between columns 35 and 36 is out of place and should be deleted from this location.

Col. 35, line 65 (Claim 1): The notation -- (I) -- should be added beneath the chemical formula.

Col. 37, lines 35-45 (Claim 16): The chemical formula appearing at this location is written incorrectly – it should be deleted and replaced with the following correct formula:

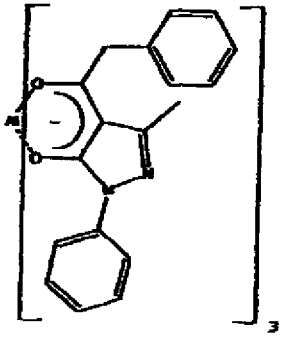

Signed and Sealed this
Sixth Day of March, 2012

David J. Kappos
*Director of the United States Patent and Trademark Office*

Col. 37, lines 52-66 (Claim 16): The chemical formula appearing at this location is written incorrectly — it should be deleted and replaced with the following correct formula:

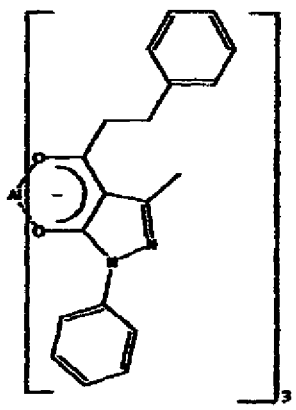

Col. 41, lines 5-15 (Claim 29): The chemical formula appearing at this location is written incorrectly — it should be deleted and replaced with the following correct formula:

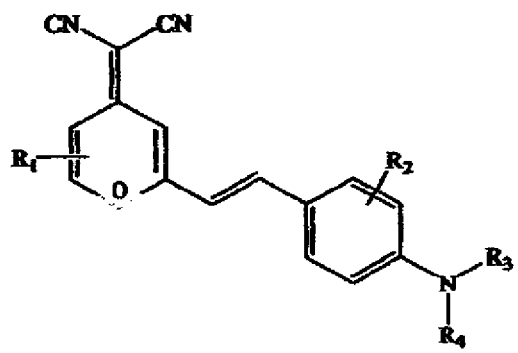

Col. 42, lines 32-42 (Claim 31): The chemical formula appearing at this location is written incorrectly — it should be deleted and replaced with the following correct formula:

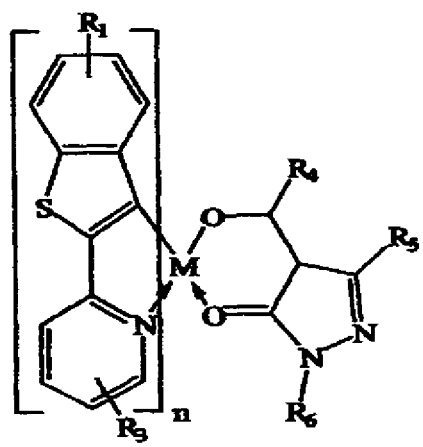

CERTIFICATE OF CORRECTION (continued)

Col. 43, lines 35-48 (Claim 32): The chemical formula appearing at this location is written incorrectly – it should be deleted and replaced with the following correct formula:

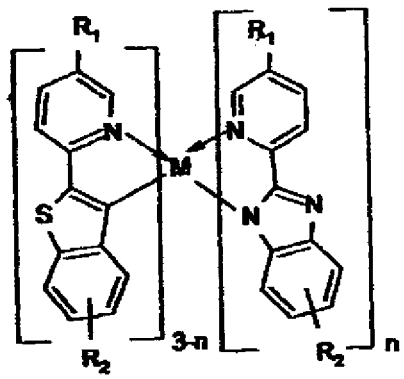

Col. 43, line 18 (Claim 32): The notation "(I)" appearing between columns 43 and 44 is out of place and should be deleted from this location.

Col. 44, line 15 (Claim 33): The notation -- (I) -- should be added beneath the chemical formula.